United States Patent
Boliek et al.

(10) Patent No.: US 7,382,925 B2
(45) Date of Patent: Jun. 3, 2008

(54) COMPRESSION AND DECOMPRESSION SYSTEM WITH REVERSIBLE WAVELETS AND LOSSY RECONSTRUCTION

(75) Inventors: Martin Boliek, San Francisco, CA (US); Michael J. Gormish, Redwood City, CA (US); Alexander F. Keith, Palo Alto, CA (US); Edward L. Schwartz, Sunnyvale, CA (US)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/233,808

(22) Filed: Sep. 23, 2005

(65) Prior Publication Data

US 2006/0023963 A1 Feb. 2, 2006

Related U.S. Application Data

(60) Division of application No. 10/718,226, filed on Nov. 19, 2003, now Pat. No. 6,996,281, which is a division of application No. 09/562,648, filed on May 1, 2000, now Pat. No. 6,754,394, which is a continuation of application No. 08/940,831, filed on Sep. 30, 1997, now Pat. No. 6,141,446, which is a continuation-in-part of application No. 08/643,268, filed on May 3, 1996, now Pat. No. 5,966,465, which is a continuation-in-part of application No. 08/498,036, filed on Jun. 30, 1995, now Pat. No. 5,867,602, which is a continuation-in-part of application No. 08/310,146, filed on Sep. 21, 1994, now Pat. No. 5,748,786.

(51) Int. Cl.
*G06K 9/36* (2006.01)
*G06K 9/46* (2006.01)

(52) U.S. Cl. .................................. 382/233; 382/251
(58) Field of Classification Search ............... 382/232, 382/233, 238, 240, 251
See application file for complete search history.

(56) References Cited

U.S. PATENT DOCUMENTS

| | | | |
|---|---|---|---|
| 4,656,514 A | 4/1987 | Wilkinson et al. |
| 4,901,075 A | 2/1990 | Vogel |
| 5,321,522 A | 6/1994 | Eschbach |
| 5,481,308 A | 1/1996 | Hartung et al. |

(Continued)

FOREIGN PATENT DOCUMENTS

EP 0030437 A1 1/1980

(Continued)

OTHER PUBLICATIONS

Chui, et al., "Wavelets on a Bounded Interval," Numberical Methods of Approximation Theory, vol. 9, 1992, p. 53-75.

*Primary Examiner*—Phuoc Tran
(74) *Attorney, Agent, or Firm*—Blakely, Sokoloff, Taylor & Zafman LLP

(57) ABSTRACT

A method and apparatus for encoding and decoding data that includes generating transformed signals in response to input data. In one embodiment, the transformed signals are generated using a reversible wavelet transform. The present invention also includes a method and apparatus for compressing the transform signals into data representing a losslessly compressed version of the input data. In one embodiment, the present invention decomposes the input data using reversible wavelet transforms.

8 Claims, 31 Drawing Sheets

U.S. PATENT DOCUMENTS

| | | |
|---|---|---|
| 5,491,685 A | 2/1996 | Klein et al. |
| 5,600,373 A | 2/1997 | Chui et al. |
| 5,621,466 A | 4/1997 | Miyane et al. |
| 5,729,631 A | 3/1998 | Wober et al. |
| 5,787,203 A | 7/1998 | Lee et al. |
| 5,818,964 A | 10/1998 | Itoh |
| 5,841,969 A | 11/1998 | Fye |
| 5,881,176 A | 3/1999 | Keith et al. |
| 6,078,690 A | 6/2000 | Yamada et al. |
| 6,625,321 B1 * | 9/2003 | Li et al. .................. 382/239 |

FOREIGN PATENT DOCUMENTS

| | | |
|---|---|---|
| EP | 0414193 A2 | 2/1990 |
| GB | 211833 A | 2/1982 |
| GB | 2260459 A | 4/1993 |
| GB | 2303031 | 6/1996 |
| GB | 2311704 A | 1/1997 |
| GB | 2247132 A | 2/2002 |

* cited by examiner

| 0 | 1 | 2 | 3 | 4 | 5 |
|---|---|---|---|---|---|
| 6 | 7 | 8 | 9 | 10 | 11 |
| 12 | 13 | 14 | 15 | 16 | 17 |
| 18 | 19 | 20 | 21 | 22 | 23 |
| 24 | 25 | 26 | 27 | 28 | 29 |
| 30 | 31 | 32 | 33 | 34 | 35 |
| 36 | 37 | 38 | 39 | 40 | 41 |

FIG. 5

| b | b+2 | b+2 |
|---|-----|-----|
| b+2 | b+3 | |
| b+2 | | b+3 |

FIG. 10

| NW | N | NE |
|----|---|----|
| W  | P | E  |
| SW | S | SE |

FIG. 13

Coefficient contribution
West        2 bits
East        1 bit
South       1 bit

| Coefficient contribution | |
|---|---|
| Northwest | 1 bit |
| North | 2 bits |
| West | 2 bits |
| East | 1 bit |
| South | 1 bit |
| Parent | 2 bits |

|   |   |   |
|---|---|---|
| Type B | Type A | |
| Type A | Target | Type B |
| | Type B | |

Parent Type A

| | | | | | | | | |
|---|---|---|---|---|---|---|---|---|
| 3 | -22 | 0 | 22 | -3 | | | | |
| | 3 | -22 | 0 | 22 | -3 | | | |
| | | 3 | -22 | 0 | 22 | -3 | | |
| | | | 3 | -22 | 0 | 22 | -3 | |

FIG. 26

| | | | | | | | | |
|---|---|---|---|---|---|---|---|---|
| 3 | -22 | 0 | 22, -3 | | | | | |
| | 3 | -22, -3 | 22 | | | | | |
| | | 22, -3 | 22, 3 | | | | | |
| | | -22 | -22, 3 | 22, 3 | 0 | | | |
| | | | | | -22 | -3 | | |
| | | | | | | 22 | -3 | |
| | | | | | | | 22 | -3 |

| | | | |
|---|---|---|---|
| | | | |
| | | | |
| | -3 | -3 | |
| -3 | 22 | 22 | -3 |
| 3 | -22 | -22 | 3 |
| | 3 | 3 | |
| | | | |
| | | | |
| | | | |

FIG. 27

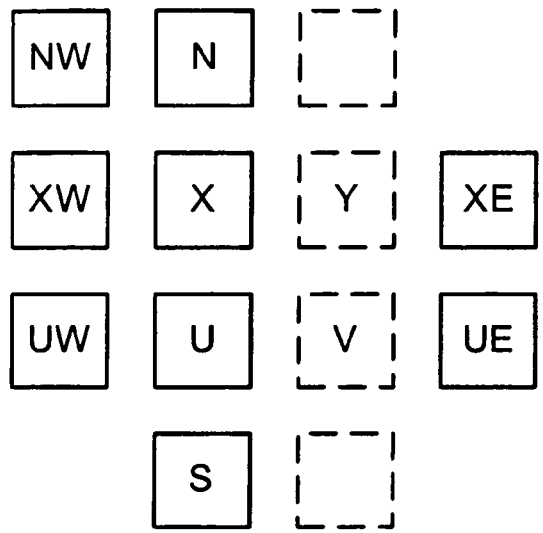
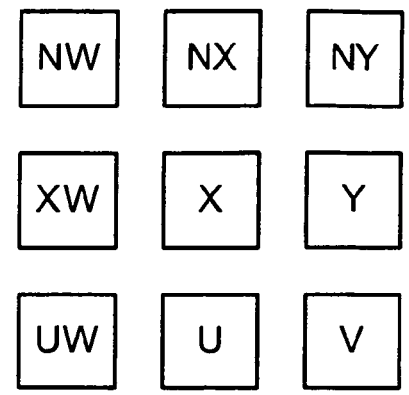
FIG. 38A  FIG. 38B
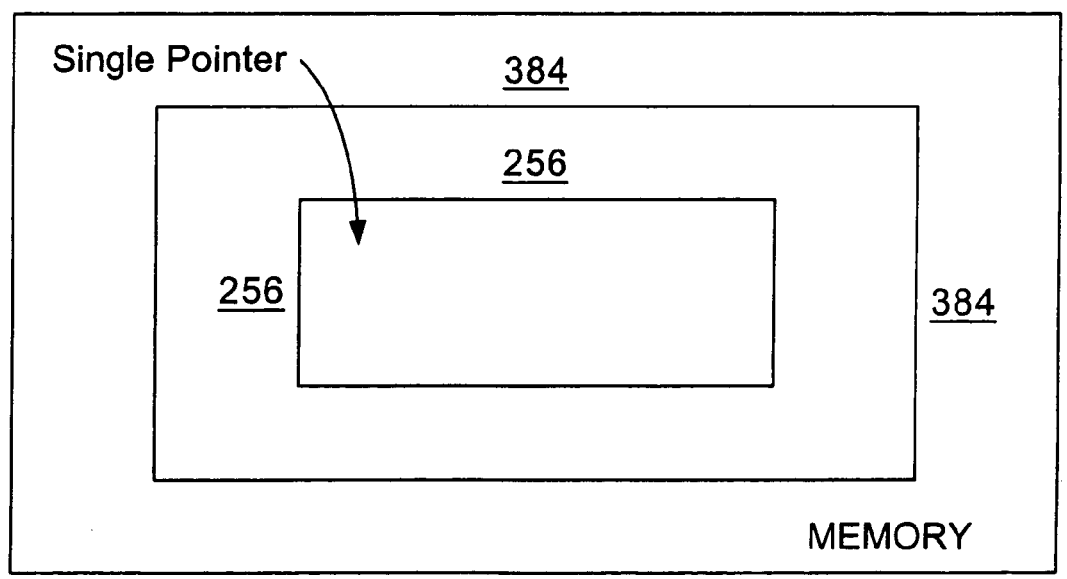
FIG. 33

| X | X | X | X | X |
|---|---|---|---|---|
| X | X | Target | | |

COMPRESSION AND DECOMPRESSION SYSTEM WITH REVERSIBLE WAVELETS AND LOSSY RECONSTRUCTION

This application is a divisional of application Ser. No. 10/718,226, filed Nov. 19, 2003 U.S. Pat. No. 6,996,281, issued Feb. 7, 2006 entitled "Compression and Decompression System with Reversible Wavelets and Lossy Reconstruction," which is a divisional of application Ser. No. 09/562,648, filed May 1, 200 U.S. Pat. No. 6,754,394, issued Jun. 22, 2004, entitled "Compression and Decompression System with Reversible Wavelets and Lossy Reconstruction," which is a continuation of application Ser. No. 08/940, 831, filed Sep. 30, 2007 U.S. Pat. No. 6,141,446, issued Oct. 31, 2000, entitled "Compression and Decompression System with Reversible Wavelets and Lossy Reconstruction", which is a continuation-in-part of application Ser. No. 08/643,268, filed May 3, 1996 U.S. Pat. No. 5,966,465, issued Oct. 12, 1999, entitled "Compression/Decompression Using Reversible Embedded Wavelets", which is a continuation-in-part of application Ser. No. 08/498,036, filed Jun. 30, 1995 U.S. Pat. No. 5,867,602, issued Feb. 2, 1999, entitled "Reversible Wavelet Transform and Embedded Codestream Manipulation", which is a continuation-in-part of application Ser. No. 08/310,146, filed Sep. 21, 1994 U.S. Pat. No. 5,748,786, issued on May 5, 1998, entitled "Apparatus for Compression Using Reversible Embedded Wavelets", assigned to the corporate assignee of the present invention and incorporated by reference herein.

FIELD OF THE INVENTION

The present invention relates to the field of data compression and decompression systems; particularly, the present invention relates to a method and apparatus for lossless and lossy encoding and decoding of data in compression/decompression systems.

BACKGROUND OF THE INVENTION

Data compression is an extremely useful tool for storing and transmitting large amounts of data. For example, the time required to transmit an image, such as a facsimile transmission of a document, is reduced drastically when compression is used to decrease the number of bits required to recreate the image.

Many different data compression techniques exist in the prior art. Compression techniques can be divided into two broad categories, lossy coding and lossless coding. Lossy coding involves coding that results in the loss of information, such that there is no guarantee of perfect reconstruction of the original data. The goal of lossy compression is that changes to the original data are done in such a way that they are not objectionable or detectable. In lossless compression, all the information is retained and the data is compressed in a manner which allows for perfect reconstruction.

In lossless compression, input symbols or intensity data are converted to output codewords. The input may include image, audio, one-dimensional (e.g., data changing spatially or temporally), two-dimensional (e.g., data changing in two spatial directions (or one spatial and one temporal dimension)), or multi-dimensional/multi-spectral data. If the compression is successful, the codewords are represented in fewer bits than the number of bits required for the uncoded input symbols (or intensity data). Lossless coding methods include dictionary methods of coding (e.g., Lempel-Ziv), run length encoding, enumerative coding and entropy coding. In lossless image compression, compression is based on predictions or contexts, plus coding. The JBIG standard for facsimile compression (ISO/IEC 11544) and DPCM (differential pulse code modulation—an option in the JPEG standard (ISO/IEC 10918)) for continuous-tone images are examples of lossless compression for images. In lossy compression, input symbols or intensity data are quantized prior to conversion to output codewords. Quantization is intended to preserve relevant characteristics of the data while eliminating unimportant characteristics. Prior to quantization, lossy compression system often use a transform to provide energy compaction. JPEG is an example of a lossy coding method for image data.

Recent developments in image signal processing continue to focus attention on a need for efficient and accurate forms of data compression coding. Various forms of transform or pyramidal signal processing have been proposed, including multi-resolution pyramidal processing and wavelet pyramidal processing. These forms are also referred to as subband processing and hierarchical processing. Wavelet pyramidal processing of image data is a specific type of multi-resolution pyramidal processing that may use quadrature mirror filters (QMFs) to produce subband decomposition of an original image. Note that other types of non-QMF wavelets exist. For more information on wavelet processing, see Antonini, M., et al., "Image Coding Using Wavelet Transform", *IEEE Transactions on Image Processing* Vol. 1, No. 2, April 1992; Shapiro, J., "An Embedded Hierarchical Image Coder Using Zerotrees of Wavelet Coefficients", *Proc. IEEE Data Compression Conference*, pgs. 214-223, 1993. For information on reversible transforms, see Said, A. and Pearlman, W. "Reversible Image Compression via Multiresolution Representation and Predictive Coding", Dept. of Electrical, Computer and Systems Engineering, Renssealaer Polytechnic Institute, Troy, N.Y. 1993.

Quantization of wavelet coefficients results in pleasing images because wavelet filters are overlapped. In contrast, quantization of block-based, non-overlapped transform coefficients suffer from artifacts at boundaries that are not pleasing.

Removing blocking artifacts from traditional block-based transforms such as the DCT is difficult for many reasons. The boundary affects every coefficient. Each transform coefficient affects many spatial domain locations. Smoothness in the transform domain involves complex relationships between many coefficients. For example, the class of all 2D linear ramps in the spatial domain does not have a nice DCT representation. It is difficult to combine transform domain smoothness constraints and quantization constraints. Typically, iterative solutions are used, with an enhancement operation (smoothing/de-ringing/edge enhancement) being performed in the spatial domain followed by limiting in the transform domain to keep the enhancement within the quantization error.

Edges are often the cause of artifacts in an image. Edge extraction is well known in the art as a means to identify edges and to remove the edges from an image. The use of gaussians in edge detection has a long history. For instance, see E. Marr and E. Hildreth, "Theory of Edged Section," Proc. R. SOC. London, Vol. 207, pp. 187-217, 1980; V. T. and Thomaso A. Poggio, "On Edge Detection," IEEE Trans. on Pattern Analysis and Machine Intelligence, Vol. 8, pp. 147-63, 1986; L. Basano, D. Caprile, et al., "Edge-Detection Schemes Highly Suitable for Hardware Implementation," J. Opt. Soc. Am., Vol. 5, pp. 1170-1175, 1988; and S. Mallate and S. Zhong, "Characterization of Signals from Multiscale Edges," IEEE Trans. on Pattern Analysis and Machine Intelligence, Vol. 14, pp. 710-732, 1992. However, even though these methods for detecting edges existed in the prior art, there is always a desire to improve the edge detection so that reconstructions can be made with sharp edges without artifacts near the edges.

Compression is often very time consuming and memory intensive. It is desirable to perform compression faster and/or with reduced memory when possible. Some applications have never used compression because either the quality could not be assured, the compression rate was not high enough, or the data rate was not controllable. However, the use of compression is desirable to reduce the amount of information to be transferred and/or stored.

SUMMARY OF THE INVENTION

A method and apparatus for performing reconstruction is described. The method in the present invention provides for receiving DS and DD coefficients affected by a boundary, reconstructing SD coefficients to be smooth across the boundary, applying a vertical inverse transform individually on each tile, reconstructing D coefficients to be smooth across the boundary, and applying a horizontal inverse transform individually on each tile.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 5 illustrates a tiled image.

FIG. 10 illustrates the bit depths of the various coefficients in a two-level TS-transform and TT-transform decomposition from an input image with b bits per pixel.

FIG. 13 shows the neighborhood coefficients for every coefficient of a coding unit.

FIG. 19 illustrates a neighborhood and parent coefficient contribution to the head bit context model.

FIG. 25 shows the weights used to compute $P_f$ across tile boundaries (full-frame).

FIG. 26 shows the weights used to compute $P_t$ on a single tile boundary with mirroring.

FIG. 27 illustrates weights for calculating $P_f$-$P_t$ approximately.

FIG. 33 illustrates an example of a single tile buffer.

FIG. 37 illustrates the neighbor coefficients that contribute to the context for the binary-style context model.

FIGS. 38A and 38B illustrate two examples of nine pointers that are maintained to point to memory locations for the next context.

FIG. 41 illustrates one embodiment of the BVI tag.

DETAILED DESCRIPTION OF THE PRESENT INVENTION

Figure 1:
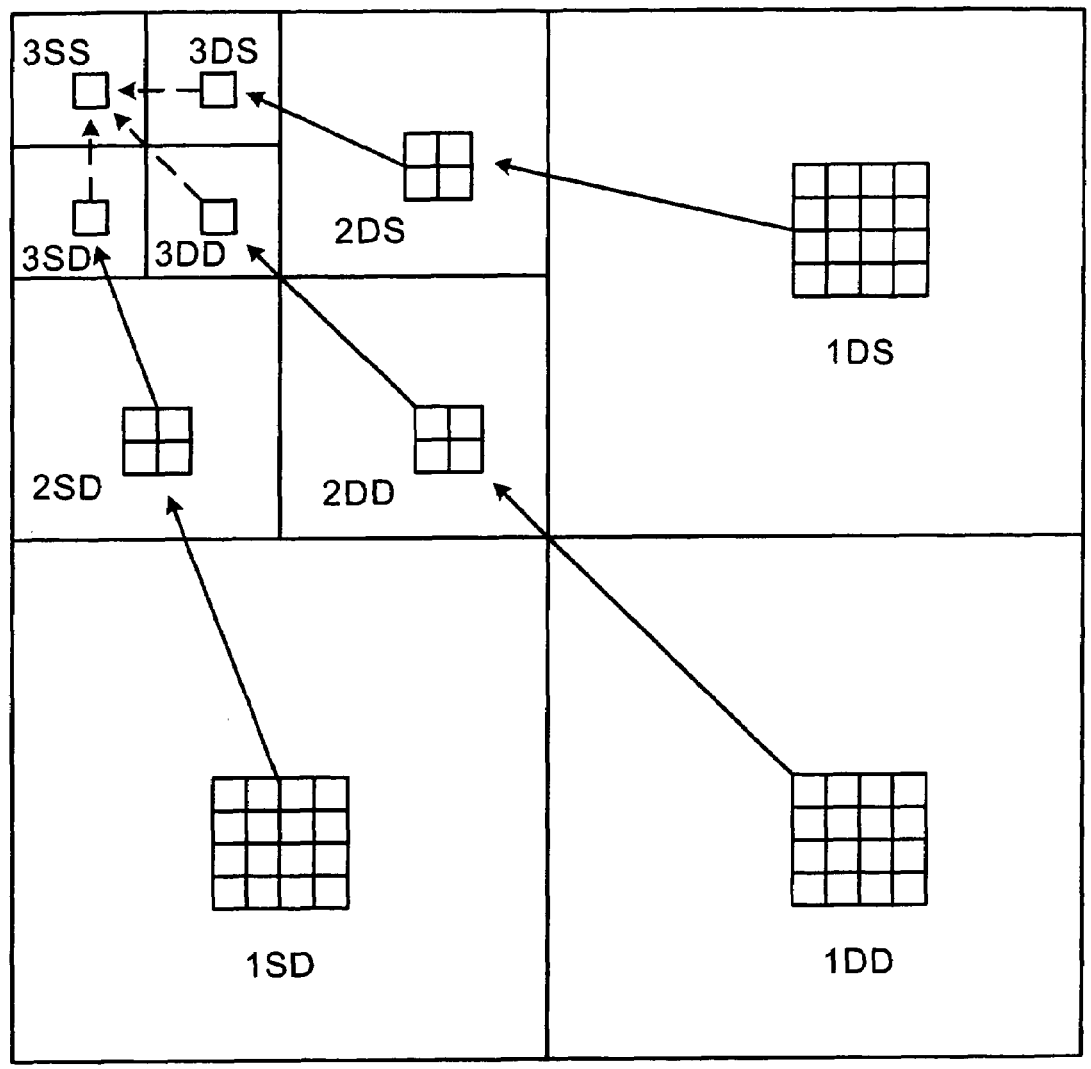
FIG. 1 shows the context dependent relationships in which Children are conditioned on their parents.

A method and apparatus for compression and decompression are described. In the following description, numerous details are set forth, such as numbers of bits, bit rates, types of filters, etc. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magneto-optical disks, read-only memories (ROMs), random access memories (RAMs), EPROMs, EEPROMs, magnetic or optical cards, or any type of media suitable for storing electronic instructions, and each coupled to a computer system bus. The algorithms and displays presented herein are not inherently related to any particular computer or other apparatus. Various general purpose machines may be used with programs in accordance with the teachings herein, or it may prove convenient to construct more specialized apparatus to perform the required method steps. The required structure for a variety of these machines will appear from the description below. In addition, the present invention is not described with reference to any particular programming language. It will be appreciated that a variety of programming languages may be used to implement the teachings of the invention as described herein.

The following terms are used in the description that follows. A definition has been included for these various terms. However, the definition provided should not be considered limiting to the extent that the terms are known in the art. These definitions are provided to help in the understanding of the present invention.

alignment: The degree of shifting of the transform coefficients in a frequency band with respect to the other frequency bands.

Arithmetic coding: Shannon/Elias Coding with finite precision arithmetic, not necessarily a binary entropy coder.

B-coding: A binary entropy coder that uses a finite state machine for compression. Unlike Huffman coding, using the finite state machine does well with binary symbols, and is useful for a range of input probabilities.

Binary entropy coder: A noiseless coder which acts on binary (yes/no) decisions, often expressed as the most probable symbol (mps) and least probable symbol (lps).

binary-style: Coding style with edge-fill Gray encoding of the pixels and a particular context model.

binary-style context model: A context model for bi-level and limited-level image data.

bit-significance: A number representation, similar to sign magnitude, with head bits, followed by the sign bit, followed by tail bits, if any. The embedding encodes in bit-plane order with respect to this representation.

child-based order: A scan order through a two dimensional image. It is similar to raster order except that the scan works on two by two blocks. Consider scanning a "parent" frequency band in raster order. Each coefficient will have four children. These children are ordered from top-left, top-right, bottom-left, and bottom-right followed by the next parent and the next set of four children and so on until the end of the line. Then processing returns to the next two lines and eventually ends in the lower right corner. No lines are skipped. Child-based order is also referred to as 2×2 block order.

codestream: A code portion of image data, including the header signaling. In an alternate embodiment, the header signaling is not included.

coefficient: Components after the transform.

components: Constituent parts of the image. The components make up the pixels. For example, the red, green, and blue bands are component bands. Each individual pixel is made up of a red, green, and blue component. Components and component bands can contain any type of information that has a spatial mapping to the image.

context model: Causally available information relative to the current bit to be coded that gives historically-learned information about the current bit, enabling conditional probability estimation for entropy coding.

efficient transform: Transform that achieves the best energy compaction into the coefficients while using the minimum number of bits to represent those coefficients.

Embedded context model: A context model which separates the context bins and results into levels of importance in such a way that effective lossy compression is obtained if the more important values are retained.

Embedded with ordering: A special case of embedded context models where there is not an explicit labeling of importance, but rather the compressed data is ordered with the most important data in the front.

embedded quantization: Quantization that is implied by the codestream. For example, if the importance levels are placed in order, from the most important to the least, then quantization is performed by simple truncation of the codestream. The same functionality is available with tags, markers, pointers, or other signaling. Multiple quantizations can be performed on an image at decode, but only one embedded quantization can be performed at encode time.

entropy coder: A device that encodes or decodes a current bit based on a probability estimation. An entropy coder may also be referred to herein as a multi-context binary entropy coder. The context of the current bit is some chosen configuration of "nearby" bits and allows probability estimation for the best representation of the current bit (or multiple bits). In one embodiment, an entropy coder may include a binary coder, a parallel run-length coder or a Huffman coder.

entry point: A point in the coded data that starts with a known coding state. The decoder can start decoding at this point without decoding the previous data. In most cases, this requires that the context and the binary entropy coder be reset into an initial state. The coded data for each coding unit begins at an entry point.

fixed-length: A system that converts a specific block of data to a specific block of compressed data, e.g., BTC (block truncation coding) and some forms of VQ (vector quantization). Fixed-length codes serve fixed-rate and fixed-size applications, but the rate-distortion performance is often poor compared with variable-rate systems.

fixed-rate: An application or system that maintains a certain pixel rate and has a limited bandwidth channel. In one embodiment, to attain this goal, local average compression is achieved rather than a global average compression. For example, MPEG requires a fixed-rate.

fixed-size: An application or system that has a limited size buffer. In one embodiment, to attain this goal, a global average compression is achieved, e.g., a print buffer. (An application can be fixed-rate, fixed-size, or both.)

frequency band: Each frequency band describes a group of coefficients resulting from the same sequence of filtering operations.

head bits: In bit-significance representation, the head bits are the magnitude bits from the most significant up to and including the first non-zero bit.

Huffman Coder: Generally, a fixed length code which produces an integral number of bits for each symbol.

idempotent: Coding that enables an image to be decompressed in a lossy form and recompressed to the same lossy codestream.

image tile: A rectangular region chosen to enable defining a grid of contiguous non-overlapping sub-images, each with identical parameters. In one embodiment, the coding operations operate only on the pixel and coefficient data in one image tile. This restriction allows random access and region of interest decompression. In one embodiment, image tiles are all the same size, except possibly for the right or bottom tiles. In one embodiment, image tiles can be any size up to and including the whole image.

importance levels: The unit of coded data which corresponds, before compression, to an entire bit-plane of the embedded data. The importance level includes all appropriate bit-planes from the different coefficient frequency bands.

LPS (Least Probable Symbol): The outcome in a binary decision with less than 50% probability. When the two outcomes are equally probable, it is unimportant which is designated mps or lps as long as both the encoder and decoder make the same designation.

Lossless/Noiseless/Reversible coding: Compressing data in a manner which allows perfect reconstruction of the original data.

Lossy Coding: Coding of data which does not guarantee perfect reconstruction of the original data. The changes to the original data may be performed in such a way as to not be visually objectionable or detectable. Often fixed rate is possible.

MPS (Most Probable Symbol): The outcome of a binary decision with more than 50% probability.

overlapped transform: A transform where a single source sample point contributes to multiple coefficients of the same frequency. Examples include many wavelets and the Lapped Orthogonal Transform.

parent coefficient: The coefficient or pixel in the next higher pyramidal level that covers the same image space as the current coefficient or pixel. For example, the parent of the 1SD coefficients is the 2SD coefficients which is the parent of the 3SD coefficients in FIG. 1.

Probability Estimation Machine/Module: Part of a coding system which tracks the probability within a context.

progressive pixel depth: A codestream that is ordered with deepening bit-planes of data at full image resolution.

progressive pyramidal: Succession of resolutions where each lower resolution is a linear factor of two in each dimension (a factor of four in area).

pyramidal level: Place in the wavelet decomposition pyramid. This is directly related to resolution.

Q-Coder A binary arithmetic coder where additions have been substituted for multiplications and probabilities limited to discrete values and probability estimates are updated when bits are output.

quantization: This selective elimination, or non-use, of data or information. Quantization necessarily leads to an imperfect (lossy) reconstruction. However, intelligent quantization can lead to good quality for the given amount of data.

raster order: A scan order through a two dimensional image. It starts in the upper left corner, moves left to right, then returns to the left side of the next line, finally ending in the lower right corner. No lines are skipped.

reversible transform: In one embodiment, a reversible transform is an efficient transform implemented with integer arithmetic whose compressed results can be reconstructed into the original.

tag: An uncoded part of the codestream that signals information about the coding characteristics and the bounds of the codestream. In one embodiment, tags have an identifying number that conveys their function.

tail-bits (or tail): In bit-significance representation, the tail bits are the magnitude bits with less significance than the most significant non-zero bit.

tile data segment: Portion of the codestream fully describing one coding unit.

Transform style: Coding style that uses a reversible wavelet transform for energy compaction.

TS-transform: Two-Six transform, a specific reversible wavelet filter pair with a 2-tap low pass analysis and a 6-tap high pass analysis filter. The synthesis filters are quadrature mirror of the analysis filters.

TT-transform: Two-Ten transform, a specific reversible wavelet filter pair with a 2-tap low pass analysis and a 10-tap high pass analysis filter. The synthesis filters are quadrature mirror of the analysis filters.

unified lossless/lossy: The same compression system provides a codestream capable of lossless or lossy reconstruction. In one embodiment of the present invention, this codestream is capable of both without settings or instructions to the encoder.

wavelet filters: The high and low pass synthesis and analysis filters used in wavelet transform.

wavelet transform: A transformation with both "frequency" and "time (or space)" domain constraints. In one embodiment, it is a transform comprising a high pass filter and a low pass filter. The resulting coefficients are decimated by two (critically filtered) and the filters are applied to the low pass coefficients.

wavelet trees: The coefficients, and the pixels, that are related to a single coefficient in the SS section of the highest level wavelet decomposition. The number of coefficients is a function of the number of levels. FIG. 1 illustrates the coefficients included in a wavelet tree. The span of a wavelet tree is dependent on the number of decomposition levels. For example, with one level of decomposition, a wavelet tree spans four pixels, with two levels it spans 16, etc. Table 1 below illustrates the number of pixels affected by a wavelet tree for different levels. In two dimensions, each wavelet tree comprises three subtrees called SD, DD and DS.

TABLE 1

Span of a Wavelet Tree for Different Levels of Decompression

| | Width | Height | Total |
|---|---|---|---|
| 1 level | 2 | 2 | 4 |
| 2 levels | 4 | 4 | 16 |
| 3 levels | 8 | 8 | 64 |
| 4 levels | 16 | 16 | 256 |
| 5 levels | 32 | 32 | 1024 |
| 6 levels | 64 | 64 | 4096 |

Overview of the Present Invention

The present invention provides a compression/decompression system having an encoding portion and a decoding portion. The encoding portion is responsible for encoding input data to create compressed data, while the decoding portion is responsible for decoding previously encoded data to produce a reconstructed version of the original input data. The input data may comprise a variety of data types, such as image (still or video), audio, etc. In one embodiment, the data is digital signal data; however, analog data digitized, text data formats, and other formats are possible. The source of the data may be a memory or channel for the encoding portion and/or the decoding portion.

In the present invention, elements of the encoding portion and/or the decoding portion may be implemented in hardware or software, such as that used on a computer system. The present invention provides a lossless compression/decompression system. The present invention may also be configured to perform lossy compression/decompression. The present invention may be configured to perform parsing of compressed data without decompressing.

Overview of the System of the Present Invention

The present invention represents the smooth edges and flat regions found in natural images quite well. Using reversible embedded wavelets, the present invention compresses deep pixel images. However, reversible embedded wavelets, and other wavelet and sinusoidal transform systems, are not good at representing sharp edges found in text or graphic images. This type of image can be compressed well by Gray coding followed by context-based bit-plane encoding, like the JBIG. Furthermore, noise free computer-generated images are well-modeled by binary style.

The present invention provides a binary style for compression of binary and graphic images. This also improves compression on some images that do not use the full dynamic range. In the binary style, the present invention encodes bit-planes of the image without using the wavelet transform.

Figure 2:
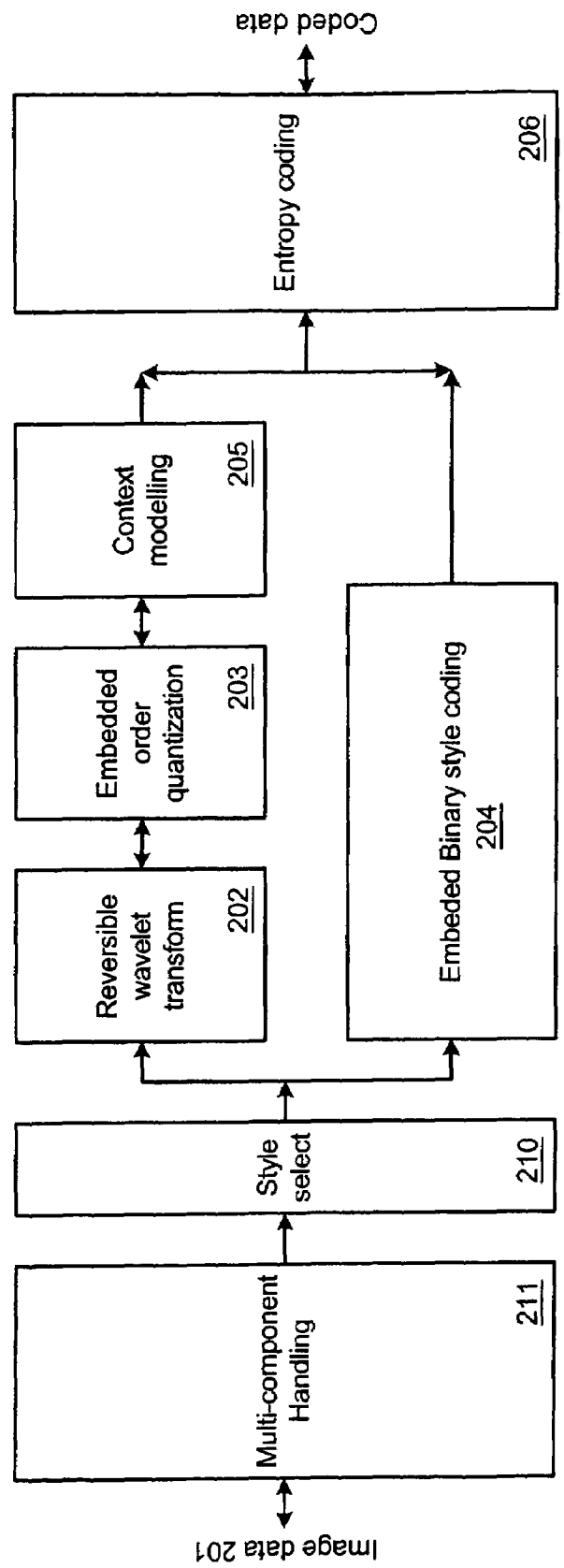
FIG. 2 is a block diagram of one embodiment of a compression system of the present invention.

FIG. 2 is a block diagram of one embodiment of a compression system of the present invention that employs the binary style. Note the decoding portion of the system operates in reverse order, along with the data flow. Referring to FIG. 2, an input image 201 into a multi-component handling mechanism 211. The multi-component handling mechanism 211 provides optional color space conversion and optional handling of subsampled image components. Style select mechanism 210 determines whether the image is a continuous-tone image or a binary image, or which portions of an image have such characteristics. The image data is forwarded onto the style select mechanism 210 which sends the image data or portions of the image data to either the wavelet style processing (blocks 202, 203, 205) or the binary style processing (block 204). In the present invention, the decision as to which mode to use is data dependent. In one embodiment, the style select mechanism 210 comprises a multiplexer. Style select 210 is not used during decoding.

In the wavelet style, the reversible wavelets block 202 performs a reversible wavelet transform. The output of block 202 is a series of coefficients. The embedded order quantization block 203 places the coefficients in bit-significance representation and then labels the coefficients in order to create an alignment of all of the coefficients in input image 201 (as generated by reversible wavelet block 202).

The image data 201 is received and (after optimal multicomponent handling) transformed using reversible wavelets in wavelet transform block 202, as defined below, to produce a series of coefficients representing a multi-resolution decomposition of the image. The reversible wavelet transforms of the present invention are not computationally complicated. The transforms may be performed in software or hardware with no systematic error. Furthermore, the wavelets of the present invention are excellent for energy compaction and compression performance. These coefficients are received by the embedded order quantization block 203.

The embedded order quantization block 203 provides embedded order quantization, as described below. The result is an embedded data stream. The embedded data stream allows a resulting codestream to be quantized at encode time, transmission time, or decode time. In one embodiment, embedded order quantization block 203 orders and converts the coefficients into sign-magnitude format.

The embedded data stream is received by the context model 205, which models data in the embedded data stream based on their significance (as described below later). In the case of the transform mode, the "bit-planes" are importance level planes of the transform coefficients and context model 205 conditions wavelet coefficients in bit-significance representation.

The results of ordering and modeling comprise decisions (or symbols) to be coded by the entropy coder 206. In one embodiment, all decisions are sent to a single coder. In another embodiment, decisions are labeled by significance, and decisions for each significance level are processed by different (physical or virtual) multiple coders. The bit stream(s) are encoded in order of significance using entropy coder 206. In one embodiment, entropy coder 206 comprises one or more binary entropy coders. In another embodiment, Huffman coding is used.

In the binary style, Gray coding block 204 performs Gray coding on the pixels in input image 201. Gray coding is a pixel operation that takes advantage of some of the correlation between the bit-planes of the pixels. This is because for any value of x and x+1, the gray (x) and gray (x+1) differ by only one bit in their radix 2 representations. In one embodiment, gray coding block 204 performs a point wise transform on 8 bit pixels:

$$\text{gray } (x) = x \text{ XOR } x/2$$

The present invention is not limited to this form of Gray coding, nor is limited to using pixels that are 8-bits in size. Note, however, that employing the above equation has an advantage of allowing a pixel to be reconstructed with only some of the most significant bits available, as is the case in progressive-by-bit-plane transmission. In other words, this form of Gray coding preserves the bit-significance ordering.

In the binary style, the data is encoded by bit-plane using a context model in coding block 204 and coder 206. In one embodiment, context model in coding block 204 conditions the current bit using spatial and importance level information.

Figure 3:
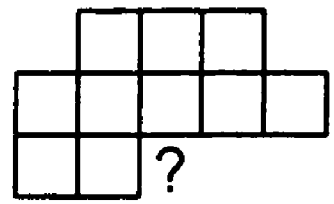
FIGS. 3 and 4 illustrate possible geometric relationships of the context model for each bit of each bit-plane in the binary style.
Figure 4:
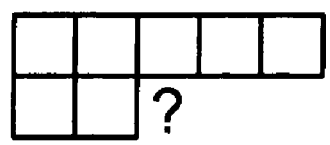

With the binary style, a JBIG-like context model is used on Gray coded pixels. In one embodiment, each bit-plane of the image tile is coded separately with each individual bit being conditioned and coded in raster order using the values of ten surrounding bits. FIG. 3 illustrates the geometric relationship of the context model for each bit of each bit-plane in the binary style. The conditioning bits lead to an adaptive probability estimate for each unique pattern. Note that some different templates may be used for the context model of the binary entropy coder when used in the bit-plane entropy coding of the Gray coded values. FIG. 4 illustrates seven pixels and two bits of bit plane information for $2^9$ context bins.

Using this context and the value of the current bit, binary coder 206 creates a bit stream. The same binary entropy coder 206 is used to code data from both the transform mode and the binary style. In one embodiment, binary coder 206 comprises a finite state machine coder that is implemented with a look-up table. Note that the present invention may be used with any binary entropy coder, such as the Q-coder, QM-coder or a high speed parallel coder.

Because the binary coder 206 is the same for either style and the Gray coding and the binary context model are simple, very little extra resources are required to have the binary style and transform style in the same system. Furthermore, while the context model configuration is different, the resource requirements are the same for both modes. That is, both use the same memory for storing contexts and both use the same binary entropy coder.

The present invention may be performed on the entire image, or, more commonly, on tiled segments of the image. Some tiles may be better compressed with the transform style and others with the binary style. There are any number of algorithms possible for choosing which mode to use. If tiles are used, then random access on a tile basis is possible. Also, regions of interest can be decoded separately to a higher fidelity. Finally, the choice of whether to use the transform or binary style can be decided on a tile-by-tile basis.

Also note that the image is still progressive by bit-plane using the dual mode system of the present invention and may be encoded in a hierarchical format as taught by JBIG.

With respect to decoding, one bit in the header of the tile may be used to denote the style used to encode the data. Style select 210 is not used. A lossless mapping, if possible, from the original dynamic range to a lower dynamic range, such as by histogram compaction (described below) can help further. A look ahead, such as in JBIG, may be used. The lookahead may employ typical prediction or deterministic prediction, such as in JBIG.

Selection of Binary or Transform Style

Style select 210 selects between the binary style and transform style. In one embodiment, the input image is encoded with both styles and style select 210 selects the style which produces the lower bit rate (assuming lossless compression). In other words, which ever mode compresses the best is selected. This method does not have as high a cost as might be expected since both the binary style and transform mode are relatively quick in software and small in hardware. A derivative of this method is to bypass the coder and use entropy values for determining the lower bit rate.

In an alternate embodiment, the present invention creates a complete (or partial) histogram of the pixel values of the image or a histogram of the differences between pairs of adjacent pixel values. In the case of the histogram of pixel values, statistical analysis of this data, such as if the histogram is peaked at a few values, far fewer than the dynamic range of the pixel depth, then the binary style is used.

In one embodiment, the present invention creates a complete (or partial) histogram of the first order differences between pairs of adjacent pixels. For a normal image, such a histogram is very Laplacian and wavelet style would be used. However, if this histogram is not peaked with a Laplacian distribution, then the binary style is used.

Both types of histograms may be generated and used together to select the style.

The $d_n$ filter output of the TS-transform or the TT-transform, both of which are discussed later, is similar to the first order statistics. This suggests a method where the transform is performed and the histogram generated. Based on the histogram, the style is chosen. If it is the transform mode, the system proceeds with the transform coefficients already generated. If the binary style is chosen the transform coefficients are discarded (or inverse transformed depending on whether the pixels were saved) and the system proceeds with the binary style.

In another embodiment, segmentation and/or previous knowledge of the document types may help determine which styles to select.

In some embodiments, the tiling size is chosen to maximize the benefit of the two styles.

Note that in one embodiment, the system of the present invention does not include binary style coding and, thus, only uses the reversible embedded wavelet compression (CREW) and decompression only.

Furthermore, the present invention provides for a decompression system. The decompression system of the present invention includes components to reverse those operations performed by the compression system, whether in a lossless or lossy manner. To avoid obscuring the present invention, the decompression system is only described where it differs from the compression system (other than simply reversing the dataflow).

The Codestream of the Present Invention

In the image compression system of the present invention, a digital image is divided into rectangular regions called tiles which are coded independently. Further, a digital image is composed of multiple components, each describing different aspects of a pixel, or pixels. (The most common example are color components, where each component describes the amount of a particular color, like red, green, or blue.) These image components are also coded independently.

Image tiles are complete, independently-coded sub-images of the whole image, defined by a regular rectangular grid placed on the image and numbered in raster order, as in FIG. 5. The tiles are usually ordered in the codestream also in raster order. The tiles on the right and bottom can be different sizes depending on the original image and the tile size. (No extra coding is required for these odd-sized tiles.) The size of the tiles are user-definable at encode time and can be any height and width, up to the size of the image.

The choice of tile size has a major impact on performance. Small tiles, especially in the vertical dimension on raster-ordered images, can allow the use of less workspace memory. However, if the tile size is too small, compression efficiency is reduced by three factors: the signaling overhead, the loss of coding efficiency on the boundaries of the tile, and the start-up adaptation of the entropy coder. It is beneficial to have tile dimensions that are a multiple of the extent of a lowest frequency component, which is a function of the number of levels ($^2$number-of-levels). Tiles of 128 by 128 or 256 by 256 seem reasonable in many applications, depending on the size of the original image.

There is nothing in the definition or syntax of tiles that prohibits compressing a sequence of images. Thus, tiled images could be different images in time (like a movie) or in space (like 3D cross sections like MRI).

Each tile contains one or more components. Each component covers, or spans, the entire tile, although each can be of different resolution in one embodiment, every tile has at least one sample from each component. These components can be of different pixel depths and can be coded in different styles. Each component is coded independently, but the coded data can be interleaved on an importance level basis.

Headers and Tags

The present invention uses tags to delimit and signal the characteristics of the codestream. Every codestream has at least two headers: the main header at the beginning of the image and a tile header at the beginning of each tile. (Every codestream contains at least one tile.)

In one embodiment, five kinds of tags are used: delimiting, fixed information, functional, pointer, and informational tags. Delimiting tags are used to frame the headers and the data. Fixed information tags profile required information about an image. Functional describe the coding functions used to code the entire title or image. Pointer tags point to the importance level in a tile (or to the next tile). Informational tags provide optional information about the data.

Pointer Tags

Pointer tags either provide a length or point into the codestream. Pointer tags may appear in the main header or in all of the tile headers. The IEM tag or IET tag described below are used if there is an entry point in the codestream or if there are multiple components. (An entry point is required whenever the component being coded changes. It is also required if the first component in a multi-component tile is not component $0$.) The ILM and ILT tags are optional; they point to the start of the coded data in an importance level.

The presence of any of these tags in the main header indicates that all these tags are in the main header. When none of these tags is in the main header, then all of the tags will be in the tile headers. The advantage to having the pointer tags all occur in the main header is that the decoder or parser can select and/or quantize a codestream without rewinding. This ability could be advantageous for applications that require fast or limited decoders and/or parsers. If the encoder is not capable of rewinding all the way to the main header, then the pointer tags can be distributed in the tile headers. This distribution is advantageous when encoding very large images or when using a hardware encoder where rewinding or storing the codestream is difficult.

Importance Level Entry Points, Main Header (IEM)

The IEM tag comprises a list of pointers to all the entry points in every tile for a given component. Each IEM tag is for a different component. Entry points are found on 8-bit boundaries at the beginning of an importance level. The importance levels that have entry points are selected at encode time. However, an entry point is required every time the component in the data stream changes. Also, if the first component is not component number $0$, an IEM pointer entry with a pointer value, 0, is required. At each entry point, the entropy coder is reset. Therefore, these entry points are handled by the decoder.

Although every IEM pointer entry must be correct, there can be redundant entries (copies). The entries must be sorted in increasing order of the pointer length. Note that since the components can be interleaved by importance level, the IEM tags for the different components could be interleaved.

In one embodiment, the IEM tag is used in the main header, if there are entry points in the file, unless a IET tag (described later) is used in every tile header. The IEM tag appears once per component, except possibly for component $0$. If the only entry point for component $0$ is Piem=0, in all tiles, no tag is required for component $0$.

The length is variable depending on the number of tiles in the image and the number of entry points in each tile.

Figure 6:
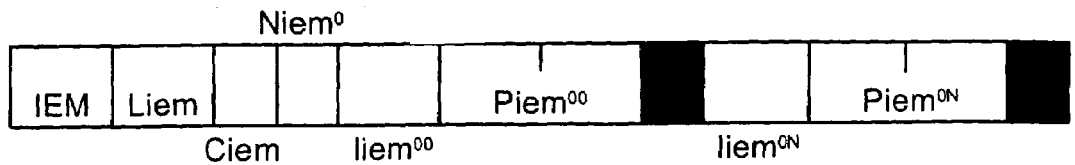
FIG. 6 illustrates importance level entry points, main header syntax.
Figure 6:
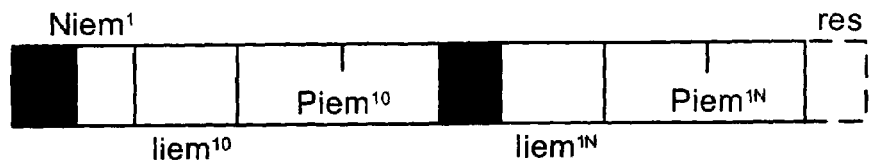

FIG. 6 illustrates the Importance level entry points, main header syntax of IEM tags with the fields described below:

IEM: Marker.
Liem: Length of tag in bytes, not including the marker.
Ciem: Component to which this tag applies. Components are numbered $0$, $1$, $2$, etc.
Niemi: Number of entry points in the ith tile. There is an Niem for each tile in the image, even if there are no entry points in that tile.
Iiemij: Number of the importance level starting at the jth entry point ith tile for the Ciem component. This Iiem tag and the corresponding Piem tag form a type of record repeated for each entry point. These records must be in order from the highest to the lowest importance levels that has an entry point.
Piemij: Number of bytes from the end of the tile header or the beginning of all coded data in that tile to the jth entry point byte. These records must be in order from the smallest pointer to the largest.
res: A filler byte of zeros that is placed at the end, as needed.

Importance Level Entry Points, Tile Header (IET)

The IET tag is a list of pointers to all the entry points in this tile for a given component. Each IET tag is for a different component. These entry points are found on 8-bit boundaries at the beginning of an importance level. The importance levels that have entry points are selected by the encoder. However, an entry point is required every time the component in the data stream changes. Also, if the first component is not component number $0$, an entry point with a pointer value, 0, is required. At each entry point, the entropy coder is reset to a known state. Therefore, these entry points must be handled by the decoder.

Although every IET pointer entry is correct, there can be redundant entries (copies). The entries are sorted in increasing order of the pointer length. Note that since the components can be interleaved by importance level, the IET tags for the different components could be interleaved.

The IET tag is used in the every tile header for a tile with entry points unless a IEM tag is used in the main header, and appears once per component, except possibly for component $0$. If the only entry point for component $0$ is Piem=0, no tag is required for component $0$.

The length of the IET tag is variable depending on the number of entry points in each tile.

Figure 7:
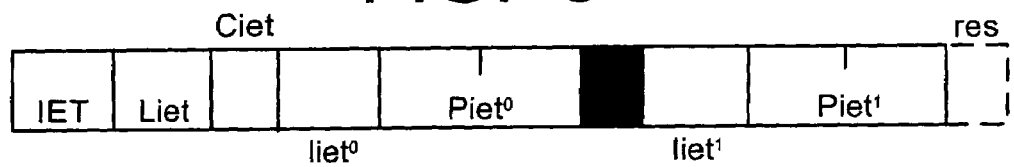
FIG. 7 illustrates importance level entry point, tile head syntax.

FIG. 7 illustrates the Importance level entry points, tile header syntax of IET tags, which include the following fields.

IET: Marker.
Liet: Length of tag in bytes, not including the marker.
Ciet: Component to which this tag applies. Components are numbered $0$, $1$, $2$, etc.
Iieti: Number of the importance level starting at the ith entry point for the Ciet component. This Iiet tag and the corresponding Piet tag form a type of record repeated for each entry point. These records are in order from the highest to the lowest importance levels that has an entry point.

Pieti: Number of bytes from the end of the tile header or the beginning of all coded data in that tile to the ith entry point byte. These records are in order from the smallest pointer to the largest.

res: A filler byte of zeros that is placed at the end.

Importance Level Locators, Main Header (ILM)

The ILM tag is a list of pointers that point to encoder selected importance levels in every tile for a given component. These importance levels are not necessarily found on 8-bit boundaries. Optimally, the pointer points to the first byte that contains data for the importance level being located (and no data from any previous importance level). However, the pointer can point to any data byte that contains data for that importance level.

Although every ILM pointer entry is correct, there can be redundant entries (copies). The entries are sorted in increasing order of the pointer length. Note that since the components can be interleaved by importance level using entry points, the ILM tags for the different components could be interleaved.

The ILM tag is optional in the main header but may not be used if pointer tags are in tile headers. There is up to one ILM per component in the main header.

The length of the ILM tag is variable depending on the number of tiles in the image and the number of locator points in each tile.

Figure 8:
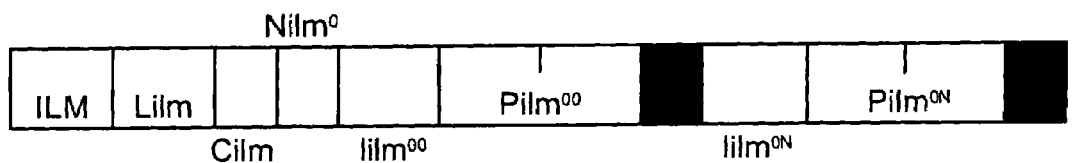
FIG. 8 illustrates importance level locators, main header syntax.
Figure 8:
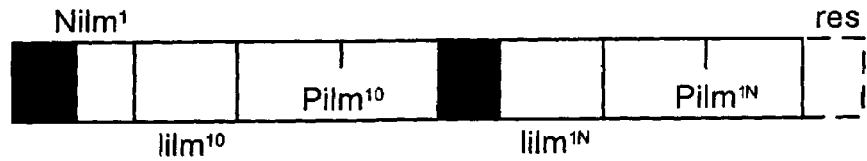

FIG. 8 illustrates the importance level locators, main header syntax for the ILM tag, which include the following fields.

ILM: Marker.

Lilm: Length of tag in bytes, not including the marker.

Cilm: Component to which this tag applies.

Nilmi: Number of locators in the ith tile. There is an Niem for each tile in the image, even if there are no locators in that tile.

Iilmij: Number of the jth importance level starting in the ith tile for the Cilm component. This Iilm tag and the corresponding Pilm tag form a type of record repeated for each locator. These records must be in order from the highest to the lowest importance levels.

Pilmij: Number of bytes from the end of the tile header or the beginning of all coded data in that tile to a data byte containing data from the jth importance level. These records are in order from the smallest pointer to the largest.

res: A filler byte of zeros that is placed at the end, as needed.

Importance Level Locators, Tile Header (ILT)

The ILT tag is a list of pointers that point to encoder selected importance levels in every tile for a given component These importance levels are not necessarily found on 8-bit boundaries. Optimally, the pointer points to the first byte that contains data for the importance level being located (and no data from any previous importance level). However, the pointer can point to any data byte that contains data for that importance level.

Although every ILT pointer entry is correct, there can be redundant entries (copies). The entries are sorted in increasing order of the pointer length. Note that since the components can be interleaved by importance level using entry points, the ILT tags for the different components could be interleaved.

The IET tag is up to one ILT per component in the tile headers but may not be used if pointer tags are in the main header. The length of the IET tag is variable depending on the number of locator points in each tile.

Figure 9:
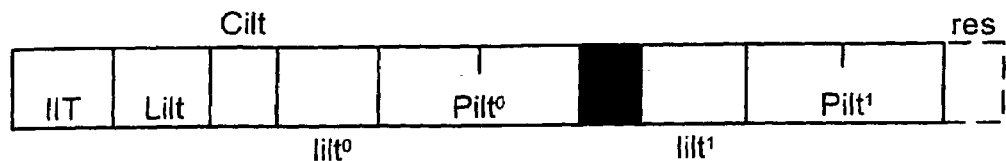
FIG. 9 illustrates importance level locators, tile header syntax.

FIG. 9 illustrates the importance level locators, tile header syntax of the ILT tag, which include the following fields:

ILT: Marker.

Lilt: Length of tag in bytes, not including the marker.

Cilt: Component to which this tag applies. Components are numbered 0, 1, 2, etc.

Iilti: Number of the importance level starting at the ith entry point for the Cilt component. This Iilt tag and the corresponding Pilt tag form a type of record repeated for each locator. These records are in order from the highest to the lowest importance levels that has a locator.

Pilmi: Number of bytes from the end of the tile header or the beginning of all coded data in that tile to a data byte containing data from the jth importance level. These records are in order from the smallest pointer to the largest.

res: A filler byte of zeros that is placed at the end.

Informational Tags

Figure 41:
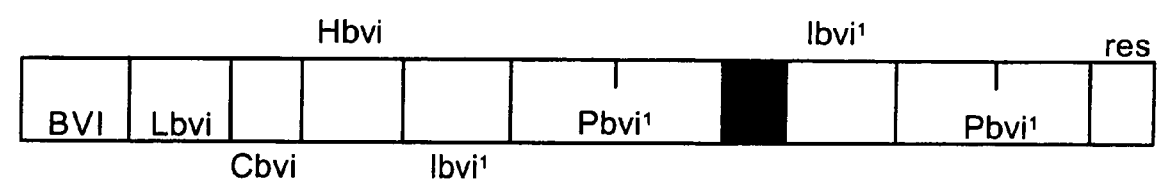

Information tags are strictly information and are not necessary for a decoder. However, these tags might assist a parser or decoder. The Bits versus importance levels (BVI) tag is an example of an informational tag, and is shown in FIG. 41 and is described in greater detail below.

Reversible Wavelets

The present invention employs compression by reversible wavelets.

Wavelet Decomposition

The present invention initially performs decomposition of an image (in the form of image data) or another data signal using reversible wavelets. In the present invention, a reversible wavelet transform comprises an implementation of an exact-reconstruction system in integer arithmetic, such that a signal with integer coefficients can be losslessly recovered. An efficient reversible transform is one with transform matrix of determinant equals 1 (or almost 1).

By using reversible wavelets, the present invention is able to provide lossless compression with finite precision arithmetic. The results generated by applying the reversible wavelet transform to the image data are a series of coefficients.

The reversible wavelet transform of the present invention may be implemented using a set of filters. In one embodiment, the filters are a Two-tap low-pass filter and a Six-tap high-pass filter to implement a transform referred to herein as the TS transform, or 2,6 transform. In another embodiment, the filters are a Two-tap low-pass filter and a Ten-tap high-pass filter to implement a transform referred to herein as the TT transform, or 2,10 transform.

Two-Dimensional Wavelet Decomposition

Using the low-pass and high-pass filters of the present invention, a multi-resolution decomposition is performed. The number of levels of composition is variable and may be any number; however, currently the number of decomposition levels equals from two to eight levels. The maximum number of levels is the $\log_2$ of the maximum of the length or width of the input.

The most common way to perform the transform on two-dimensional data, such as an image, is to apply the one-dimensional filters separately, i.e., along the rows and then along the columns. The first level of decomposition leads to four different bands of coefficients, referred to herein as SS, DS, SD, and DD. The letters refer to the smooth (S) and detail (D) filters defined above, which correspond to low (L) and high (H) pass filters respectively. Hence, the SS band consist of coefficients from the smooth filter in both row and column directions.

Each frequency subband in a wavelet decomposition can be further decomposed. The most common practice is to only decompose the SS frequency subband further, and may include further decomposing of the SS frequency subband in each decomposition level as each is generated. Such a multiple decomposition is referred to as a pyramidal decomposition. The designations SS, SD, DS, DD and the decomposition level number denote each decomposition.

Note that with either the TS or TT transforms of the present invention, the pyramidal decomposition does not increase the coefficient size.

If the reversible wavelet transform is recursively applied to an image, the first level of decomposition operates on the finest detail, or resolution. At a first decomposition level, the image is decomposed into four sub-images (e.g., subbands). Each subband represents a band of spatial frequencies. The first level subbands are designated 1SS, 1SD, 1DS, and 1DD. The process of decomposing the original image involves subsampling by two in both horizontal and vertical dimensions, such that the first level subbands 1SS, 1SD, 1DS and 1DD each have one-fourth as many coefficients as the input has pixels (or coefficients) of the image.

Subband 1SS contains simultaneously low frequency horizontal and low frequency vertical information. Typically a large portion of the image energy is concentrated in this subband. Subband 1SD contains low frequency horizontal and high frequency vertical information (e.g., horizontal edge information). Subband 1DS contains high frequency horizontal information and low frequency vertical information (e.g., vertical edge information). Subband 1DD contains high frequency horizontal information and high frequency vertical information (e.g., texture or diagonal edge information).

Each of the succeeding second, third and fourth lower decomposition levels is produced by decomposing the low frequency SS subband of the preceding level. This subband 1SS of the first level is decomposed to produce subbands 2SS, 2SD, 2DS and 2DD of the moderate detail second level. Similarly, subband 2SS is decomposed to produce coarse detail subbands 3SS, 3SD, 3DS and 3DD of the third level. Also, subband $SS_2$ is decomposed to produce coarser detail subbands 4SS, 4SD, 4DS and 4DD of the third level. Due to subsampling by two, each second level subband is one-sixteenth the size of the original image. Each sample (e.g., pixel) at this level represents moderate detail in the original image at the same location. Similarly, each third level subband is 1/64 the size of the original image. Each pixel at this level corresponds to relatively coarse detail in the original image at the same location. Also, each fourth level subband is 1/256 the size of the original image.

Since the decomposed images are physically smaller than the original image due to subsampling, the same memory used to store the original image can be used to store all of the decomposed subbands. In other words, the original image and decomposed subbands 1SS and 2SS are discarded and are not stored in a three level decomposition.

Although only four subband decomposition levels are described, additional levels could be developed in accordance with the requirements of a particular system. Also, with other transformations such as DCT or linearly spaced subbands, different parent-child relationships may be defined.

Note that pyramidal decomposition does not increase the coefficient size with the wavelet filters of the present invention.

In other embodiments, other subbands in addition to the SS may be decomposed also.

Tree Structure of Wavelets

There is a natural and useful tree structure to wavelet coefficients in a pyramidal decomposition. A result of the subband decomposition is a single SS frequency subband corresponding to the last level of decomposition. On the other hand, there are as many SD, DS, and DD bands as the number of levels. The tree structure defines the parent of a coefficient in a frequency band to be a coefficient in a same frequency band at a lower resolution and related to the same spatial locality.

In the present invention, each tree comprises the SS coefficients and three subtrees, namely the DS, SD and DD subtrees. The processing of the present invention is typically performed on the three subtrees. The root of each tree is a purely smooth coefficient. For a two-dimensional signal such as an image, there are three subtrees, each with four children. The tree hierarchically is not limited to two dimensional signals. For example, for a one dimensional signal, each subtree has one child. Higher dimensions follow from the one-dimensional and two-dimensional cases.

The process of multi-resolution decomposition may be performed using a filtering system. For examples of a two-dimensional, two-level transform, a two-dimensional, two-level transform implemented using one-dimensional exemplary filters, see U.S. patent application Ser. No. 08/498,695, filed Jun. 30, 1995 and entitled "Method and Apparatus For Compression Using Reversible Wavelet Transforms and an Embedded Codestream" and U.S. patent application Ser. No. 08/498,036, filed Jun. 30, 1995, entitled "Reversible Wavelet Transform and Embedded Codestream Manipulation".

Performing the Forward Wavelet Transform

In the present invention, the wavelet transform is performed with two 1-D operations, horizontal then vertical. In one embodiment, one piece of hardware performs the horizontal operation while another performs the vertical operations.

The number of levels determine the number of iterations. In one embodiment, a four level decomposition is performed using the TT transform in both the horizontal and vertical directions. In another embodiment, a four level decomposition is performed using four TS-transforms instead.

The transform of the present invention is computationally efficient. In one embodiment, the present invention orders the computations performed by the transform to reduce the amount of both on-chip and off-chip memory and bandwidth required.

Computation for One Wavelet Tree

The following equations define both the TS-transform and the TT-transform. For an input x(n), the output of the low pass filter, the smooth signal s(n), and the high pass filter, the detail signal d(n) are computed as shown in the equation below.

$$\begin{cases} s(n) = \left\lfloor \frac{x(2n) + x(2n+1)}{2} \right\rfloor \\ d(n) = x(2n) - x(2n+1) + t(n) \end{cases}$$

The inverse transform is shown in the equation below.

$$\begin{cases} x(2n) = s(n) + \left\lfloor \dfrac{p(n)+1}{2} \right\rfloor \\ x(2n+1) = s(n) - \left\lfloor \dfrac{p(n)}{2} \right\rfloor \end{cases}$$

where p(n) is computed by:

$$p(n)=d(n)-t(n).$$

The TS-transform and the TT-transform differ in the definition of t(n). For the TS-transform.

$$t(n) = \left\lfloor \dfrac{-s(n-1)+s(n+1)+2}{4} \right\rfloor.$$

For the TT-transform, $$t(n) = \left\lfloor \dfrac{3s(n-2)-22s(n-1)+22s(n+1)-3s(n+2)+32}{64} \right\rfloor$$

Note that in the following discussion the notation $\lfloor \cdot \rfloor$ means to round down or truncate and is sometimes referred to as the floor function.

These filters may be implemented using only addition and subtraction operations (plus hardwired bit shifting). For instance, multiplication by 3 and 22 may be performed by shifts and adds.

Note that in both the reversible TS-transform and TT transform, like the S-transform, the low-pass filter is implemented so that the range of the input signal x(n) is the same as the output signal s(n). That is, there is no growth in the smooth output. If the input signal is b bits deep, then the smooth output is also b bits. For example, if the signal is an 8-bit image, the output of the low-pass filter is also 8 bits. This is an important property for a pyramidal system where the smooth output is decompressed further by, for example, successively applying the low-pass filter. In prior art systems, the range of the output signal is greater than that of the input signal, thereby making successive applications of the filter difficult. Also, there is no systemic error due to rounding in the integer implementation of the transform, so all error in a lossy system can be controlled by quantization. In addition, the low-pass filter has only two taps which makes it a non-overlapping filter. This property is important for the hardware implementation.

Embedded Ordering

In the present invention, the coefficients generated as a result of the wavelet decomposition are entropy coded. In the present invention, the coefficients initially undergo embedded ordering in which the coefficients are ordered in a visually significant order or, more generally, ordered with respect to some error metric (e.g., distortion metric). Error or distortion metrics include, for example, peak error and mean squared error (MSE). Additionally, ordering can be performed to give preference to bit-significance spatial location, relevance for database querying, and directionality (vertical, horizontal, diagonal, etc.).

The ordering of the data is performed to create the embedded quantization of the codestream. In the present invention, two ordering systems are used: a first for ordering the coefficients and a second for ordering the binary values within a coefficient. The ordering of the present invention produces a bitstream that is thereafter coded with a binary entropy coder.

Bit-Significance Representation

Most transform coefficients are signed numbers even when the original components are unsigned (any coefficients output from at least one detail filter are signed). In one embodiment, the embedded order used for binary values within a coefficient is by bit-plane. The coefficients are expressed in bit-significance representation prior to coding. Bit-significance is a sign-magnitude representation where the sign bit, rather than being the most significant bit (MSB), is encoded with the first non-zero magnitude bit. That is, the sign bit follows the first non-zero magnitude bit rather than preceding all of the magnitude bits. Also, the sign bit is considered to be in the same bit-plane as the most significant non-zero magnitude bit.

Figure 12:
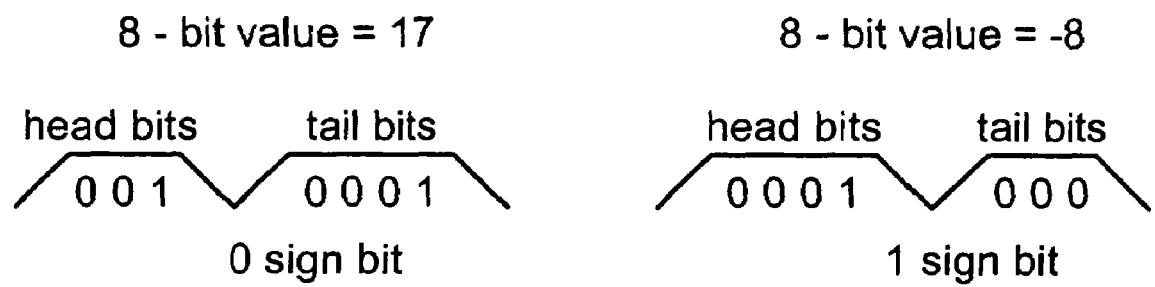
FIG. 12 illustrates examples of bit significance representation.

Bit-significance format represents a number using three sets of bits: head, tail, and sign. The head bits are all the zero bits from the MSB up to and including the first non-zero magnitude bit. The bit-plane in which the first non-zero magnitude bit occurs defines the significance of the coefficient. The set of tail bits comprises the magnitude bits after the first non-zero magnitude bit to the LSB. The sign bit simply denotes the sign, where a 0 may represent a positive sign and 1 may represent a negative sign. A number, such as $\pm 2^n$, with a non-zero bit as the MSB has only one head bit. A zero coefficient has no tail or sign bits. FIG. 12 illustrates examples of bit-significance representation. Table 2 shows all possible values for form bit coefficients ranging from −7 to 8.

TABLE 2

Bit Significance Representation for 4 Bit Values

| Decimal | 2's Complement | Sign Magnitude | Bit-Significance | | |
|---|---|---|---|---|---|
| −8 | 1000 | | | | |
| −7 | 1001 | 1111 | 11 | 1 | 1 |
| −6 | 1010 | 1110 | 11 | 1 | 0 |
| −5 | 1011 | 1101 | 11 | 0 | 1 |
| −4 | 1100 | 1100 | 11 | 0 | 0 |
| −3 | 1101 | 1011 | 0 | 11 | 1 |
| −2 | 1110 | 1010 | 0 | 11 | 0 |
| −1 | 1111 | 1001 | 0 | 0 | 11 |
| 0 | 0000 | 0000 | 0 | 0 | 0 |
| 1 | 0001 | 0001 | 0 | 0 | 10 |
| 2 | 0010 | 0010 | 0 | 10 | 0 |
| 3 | 0011 | 0011 | 0 | 10 | 1 |
| 4 | 0100 | 0100 | 10 | 0 | 0 |
| 5 | 0101 | 0101 | 10 | 0 | 1 |
| 6 | 0110 | 0110 | 10 | 1 | 0 |
| 7 | 0111 | 0111 | 10 | 1 | 1 |

In Table 2, the bit significance representation shown in each column includes one or two bits. In the case of two bits, the first bit is the first one bit and is followed by the sign bit.

In the case where the values are non-negative integers, such as occurs with respect to the intensity of pixels, the order that may be used is the bitplane order (e.g., from the most significant to the least significant bitplane). In embodiments where two's complement negative integers are also allowed, the embedded order of the sign bit is the same as the first non-zero bit of the absolute value of the integer.

Therefore, the sign bit is not considered until a non-zero bit is coded. For example, using sign magnitude notation, the 16-bit number −7 is:

1000000000000111

On a bit-plane basis, the first twelve decisions will be "insignificant" or zero. The first 1-bit occurs at the thirteenth decision. Next, the sign bit ("negative") will be coded. After the sign bit is coded, the tail bits are processed. The fifteenth and sixteenth decisions are both "1".

Since the coefficients are coded from most significant bitplane to least significant bitplane, the number of bitplanes in the data must be determined. In the present invention, this is accomplished by finding an upper bound on the magnitudes of the coefficient values calculated from the data or derived from the depth of the image and the filter coefficients. For example, if the upper bound is 149, then there are 8 bits of significance or 8 bitplanes. For speed in software, bitplane coding may not be used. In an alternate embodiment, a bitplane is coded only when a coefficient becomes significant as a binary number.

Coefficient Alignment

The present invention aligns coefficients with respect to each other before the bit-plane encoding. This is because the coefficients in the different frequency subbands represent different frequencies similar to the FFT or the DCT. By aligning coefficients, the present invention controls quantization. The less heavily quantized coefficients will be aligned toward the earlier bit-planes (e.g., shifted to the left). Thus, if the stream is truncated, these coefficients will have more bits defining them than the more heavily quantized coefficients.

Figure 39:
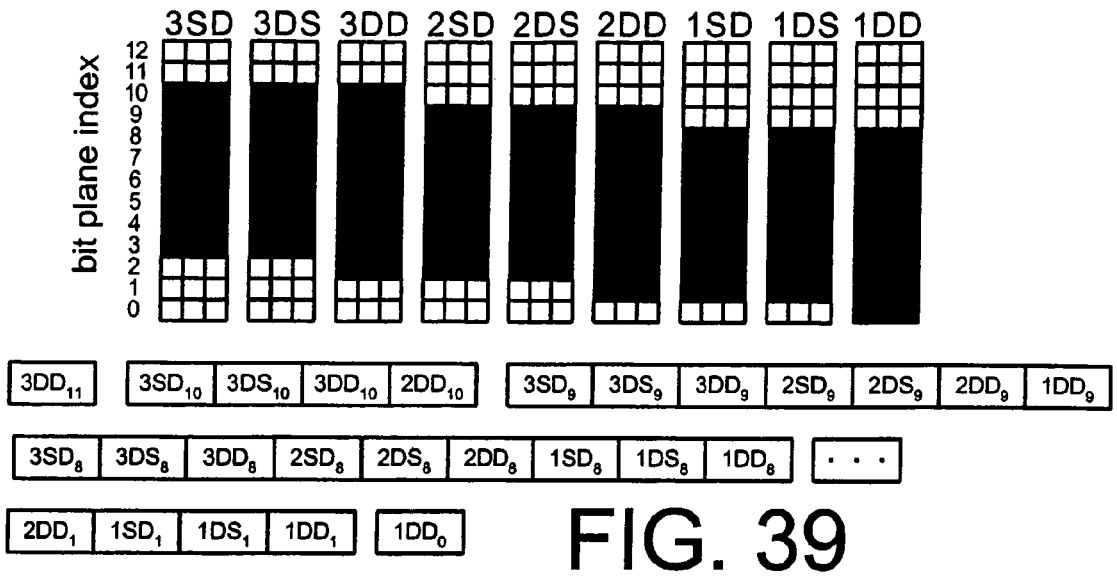
FIG. 39 illustrates a normalized alignment.
Figure 40:
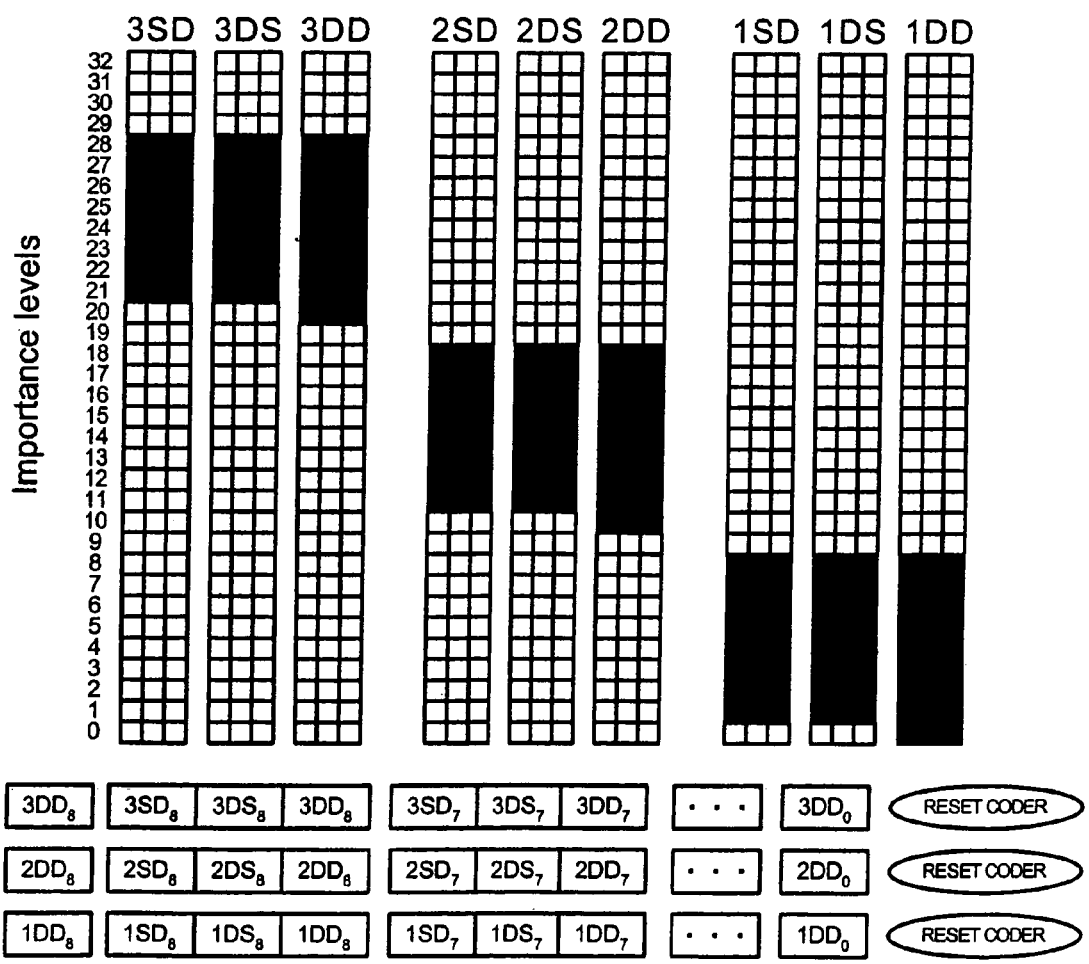
FIG. 40 illustrates a pyramidal alignment.

FIGS. 39 and 40 illustrate a normalized alignment and a pyramidal alignment, respectively.

In one embodiment, the coefficients are aligned for the best rate-distortion performance in terms of SNR or MSE. There are many possible alignments including one that is near-optimal in terms of statistical error metrics such as MSE. Alternately, the alignment could allow a physcovisual quantization of the coefficient data. The alignment has significant impact on the evolution of the image quality (or in other words on the rate-distortion curve), but has negligible impact on the final compression ratio of the lossless system. Other alignments could correspond to specific coefficient quantization, Region of Interest fidelity encoding, or resolution progressive alignment.

The alignment may be signaled in the header of the compressed data or it may be fixed for a particular application or it may be fixed for a particular application (i.e., the system only has one alignment). The alignment of the different sized coefficients is known to both the coder and decoder and has no impact on the entropy coder efficiency.

Figure 10:
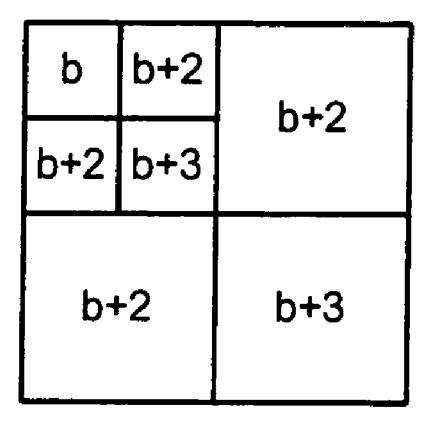
Figure 11:
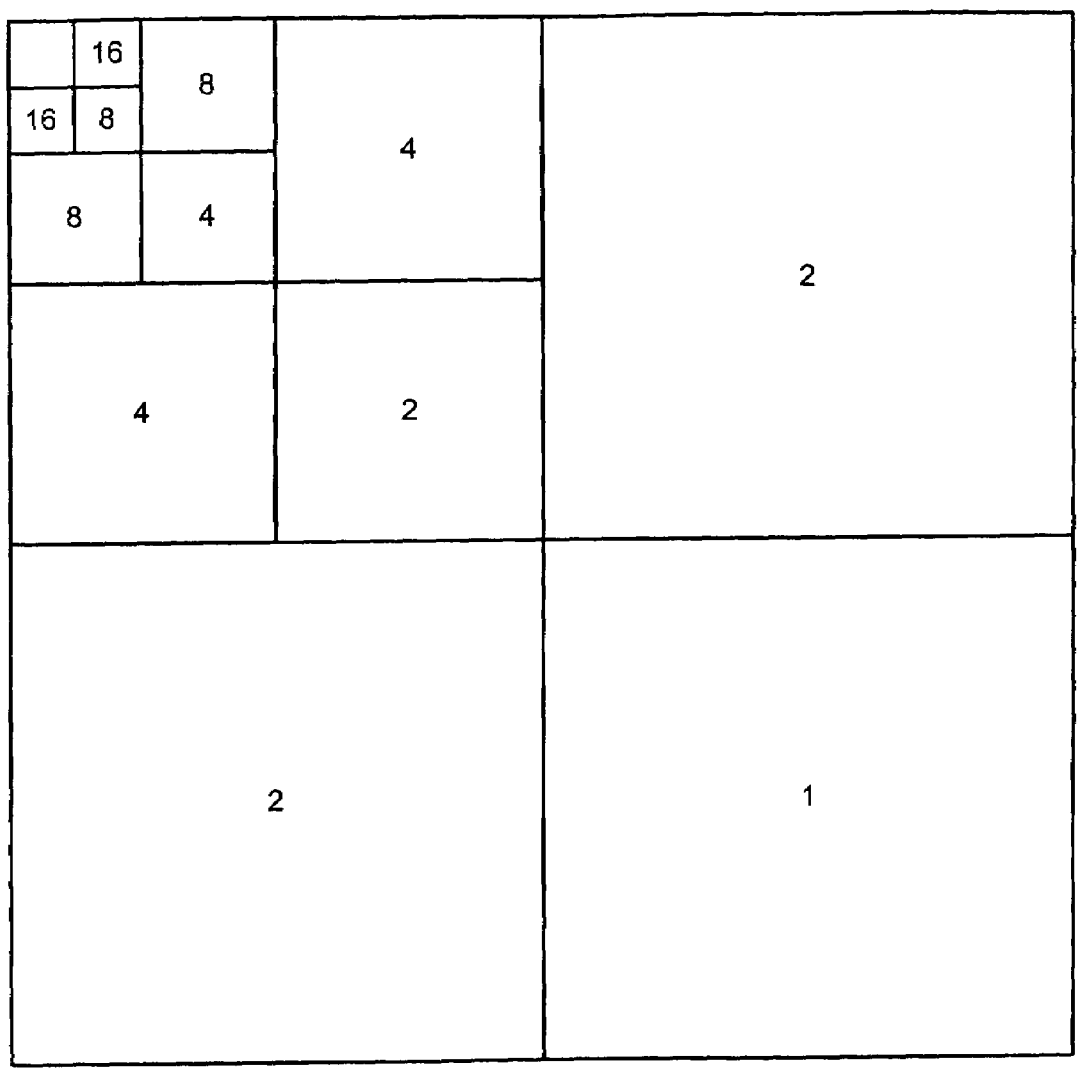
FIG. 11 is one embodiment of the multipliers or alignments for the frequency band used for coefficient alignment in the present invention.

The bit depths of the various coefficients in a two-level TS-transform and TT-transform decomposition from an input image with b bits per pixel are shown in FIG. 10. FIG. 11 is one embodiment of the multipliers for the frequency band used for coefficient alignment in the present invention. To align the coefficients, the 1-DD coefficient size is used as a reference, and shifts are given with respect to this size. A shift of n is a multiplication by $2^n$.

In one embodiment, the coefficients are shifted with respect to the magnitude of the largest coefficient to create an alignment of all the coefficients in the image. The aligned coefficients are then handled in bit-planes called importance levels, from the most significant importance level to the least significant importance level. The sign is encoded with the last head bit of each coefficient. The sign bit is in whatever importance level the last head bit is in. It is important to note that the alignment simply controls the order the bits are sent to the entropy coder. Actual padding, shifting, storage, or coding of extra zero bits is not performed.

Table 3 illustrates one embodiment of alignment numbers for aligning coefficients for normalized alignment, such as shown in FIG. 39.

TABLE 3

| Coefficient Alignment for Normalized Alignment | | | | | | | |
|---|---|---|---|---|---|---|---|
| 1-DD | 1-DS, 1-SD | 2-DD | 2-DS, 2-SD | 3-DD | 3-DS, 3-SD | 4-DD | 4-DS, 4-SD |
| reference | Left 1 | Left 1 | Left 2 | Left 2 | Left 3 | Left 3 | Left 4 |

The alignment of different sized coefficients is known to both the coder and the decoder and has no impact on the entropy coder efficiency.

Note that coding units of the same data set may have different alignments.

Ordering of the Codestream and the Context Model

In one embodiment, the codestream of the present invention comprises of a main header, tile headers, and tile data. Each tile has at least one data point from each component in the image. The component data is transformed (using transform-style or binary-style coding) and then aligned into the importance levels. The importance levels are then entropy coded using the appropriate context model and the code (e.g., FSM coder).

Note that in one embodiment the modeling and coding is a straight through process. No rearranging of the data is performed. Therefore, the entropy coded importance levels are the minimum possible coded unit in the data stream. If entry points are placed in front of an importance level (or the data is fixed-length) then the code stream can be decoded starting at that point.

The SS coefficients are classified as the most significant importance level. (Note that if the binary-style coding is used and the component is decomposed zero levels, then the coefficients are considered to be in the DD frequency band.) These coefficients (whether transform-style or binary-style) are not entropy coded. The SS coefficients are packed into the codestream in raster order with the Most Significant Bit (MSB) first and Least Significant Bit (LSB) last regardless of the depth of the coefficient. Signed components are stored as unsigned values offset by $2^{(depth-1)}$. For example 8 bit deep signed components taking on values from −128 to 127 have 128 added to there value and are stored unsigned from 0-255.

In one embodiment for each component the importance levels are ordered in the codestream from most significant (highest number) to least significant.

It is possible to enter and decode at a particular importance level with the use of entry points. Entry points are pointed to with the IEM or IET tags. The entropy coder can be reset at certain points in the codestream; the points are decided at encode-time and can only occur at the beginning of an importance level. This reset creates an entry point where the coding state information (context and probabilities) is a known initial state. The codestream is padded with bits to the next multiple of 8 bits.

The context model determines both the order in which data is coded and the conditioning used for specific bits of the data. Ordering will be considered first.

The order that the coefficients during each bit-plane are processed are from the low resolution to the high resolution (from low frequency to the high frequency). The coefficient subband coder within each bit-plane is from the high level (low resolution, low frequency) to the low level (high resolution, high frequency). Within each frequency subband, the coding is in a defined order. In one embodiment, the order may be raster order, 2×2 block order, serpentine order, Peano scan order, etc.

In the case of a four level decomposition using the codestream of one embodiment of the present invention, the order is as follows:

4-SS, 4-DS, 4-SD, 4-DD, 3-DS, 3-SD, 3-DD, 2-DS, 2-SD, 2-DD, 1-DS, 1-SD, 1-DD

One embodiment of the context model used in the present invention is described below. This model uses bits within a coding unit based on the spatial and spectral dependencies of the coefficients. The available binary values of the neighboring coefficients and parent coefficients can be used to create contexts. The contexts, however, are causal for decodability and in small numbers for efficient adaptation.

The present invention provides a context model to model the bitstream created by the coefficients in the embedded bit-significance order for the binary entropy coder.

Figure 13:
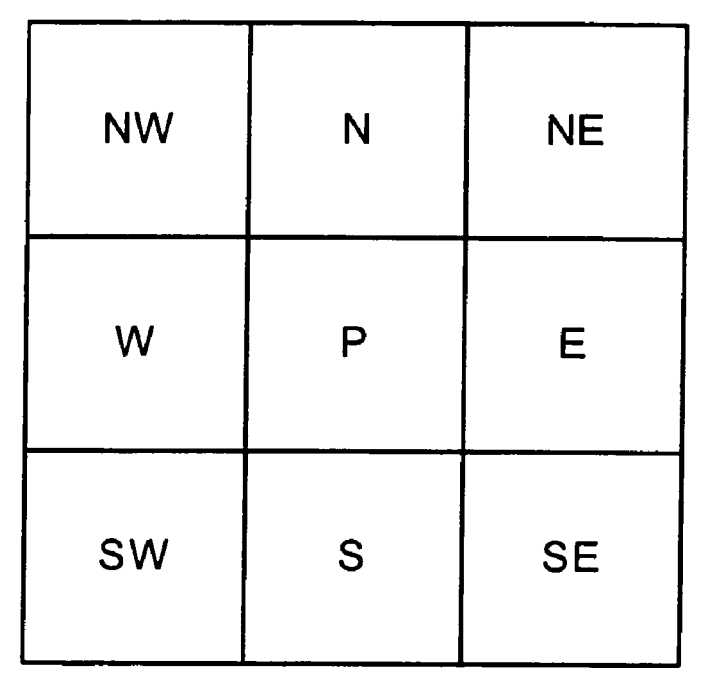

FIG. 13 shows the neighborhood coefficients for every coefficient of a coding unit. Referring to FIG. 13, the neighborhood coefficients are denoted with the obvious geographical notations (e.g., N=north, NE=northeast, etc.). Given a coefficient, such as P in FIG. 13, and a current bit-plane, the context model can use any information from all of the coding unit prior to the given bit-plane. The parent coefficient of the present coefficient is also used for this context model.

The head bits are the most compressible data. Therefore, a large amount of context, or conditioning, is used to enhance compression.

Context Model—Transform Style

One embodiment of the context model of the present invention is described below. This model uses bits within a coding unit based on the spatial and spectral dependencies of the coefficients. The available binary values of the neighboring coefficients and parent coefficients may be used to create contexts. The contexts, however, are causal for decodability and in small numbers for efficient adaptation.

In the present invention, the sign bit context model comprises encoding the sign after the last head bit. There are multiple contexts for the sign depending on whether the N coefficient is positive, negative or the sign is not yet coded.

Child-based Order

Figure 14:
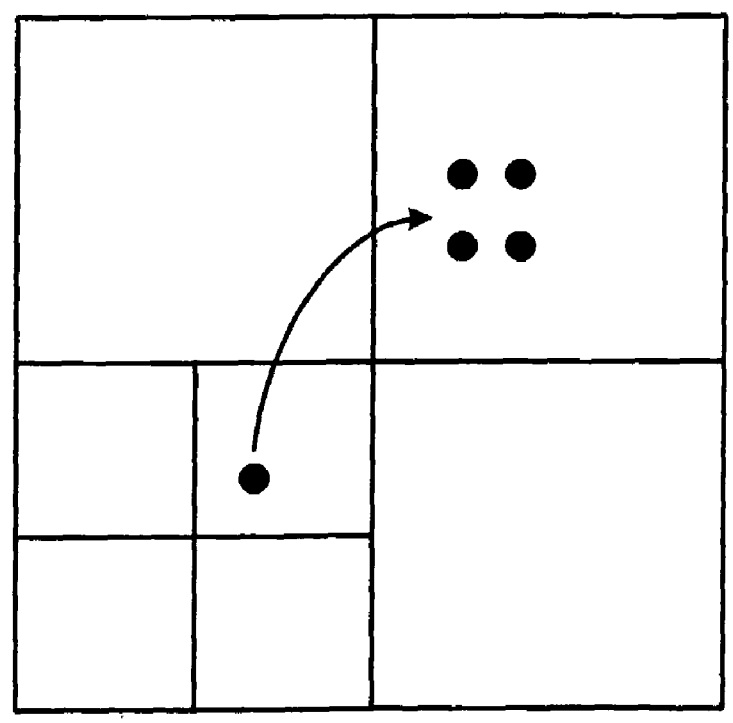
FIG. 14 illustrates a Child based scan order.
Figure 14:
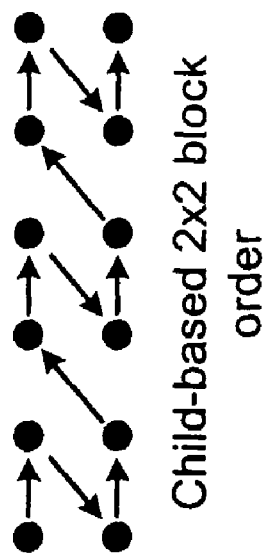

In one embodiment, the bit-planes of the individual frequency bands are coded in the order SS $DS_n$ $SD_n$ $DD_n$ ... $DS_i$ $SD_i$ $DD_i$ ... $DS_1$ $SD_1$ $DD_1$. In one embodiment, the order within a frequency band for the look-ahead, as well as the individual coding, is the child-based order. Child-based order is a scan order through the two-dimensional image, similar to raster order except for the two line, two-by-two block order. Consider scanning a "parent" frequency band in raster order. Each coefficient will have four children. These children are ordered top-left, top-right, bottom-left, then bottom-right. Then the order returns to the left side and starts the next two lines finally ending in the lower right corner. No lines are skipped. If there are an odd number of lines, the last line is in simple raster order. FIG. 14 shows this ordering.

Frequency Band Bit-plane Look-ahead

In one embodiment, the bits in the importance level are coded in the frequency band order. When coding a bit-plane of a frequency band, the first output bit indicates whether or not the entire bit-plane is zero. If it is 0, then a zero bit is delivered to the entropy coder. There is a single context for frequency band bit-plane look-ahead. The coder proceeds to the next frequency band bit-plane.

If there is at least one 1 bit, then a one bit is delivered to the entropy coder and the bit-plane is coded as described below. (Note that a one bit can be delivered to the entropy coder even if the bit-plane is all zeros. In this case, the bit-plane is coded as described below.) This pass is required for every bit-plane which could contain data. There is no bit coded for frequency bands which, because of alignment and coefficient depth, cannot have a one bit at the current importance level, or for frequency bands which contain no coefficients.

In one embodiment, neighboring and parent DS, SD and DD coefficients that do not exist due to edges of tiles are treated as 0. This treatment also applies to the process of determining whether to attempt look-ahead, the post look-ahead head bit context model and the head bit context model.

Figures 15, 16:
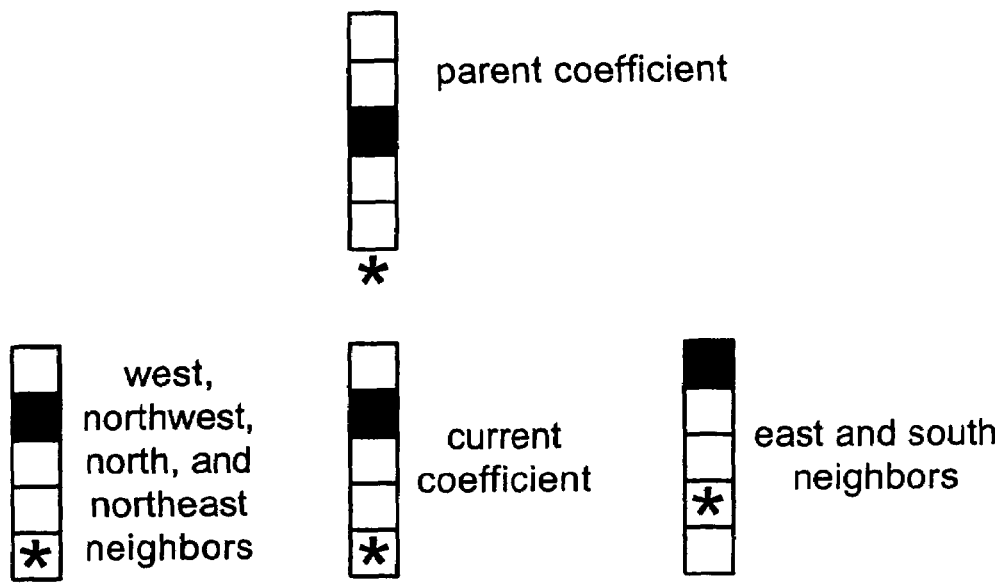
FIG. 15 illustrates a location of reference bits.
FIG. 16 illustrates coefficients used to decide whether to attempt the look-ahead.

Many of the context models described herein make use of bits from other coefficients (neighboring coefficients in the same frequency band, and the parent coefficient, etc.). In one embodiment, the bits that are examined depend on the type of neighbor. If the most significant bit of a coefficient is being coded, then the reference bit in the parent is the second most significant bit, the reference bit in the west, north-west, north, and northeast neighbors is also the most significant bit, the reference bit in the east and south neighbors is the bit more significant than the most significant bit, and thus is assumed to be zero. The reference bit to use is shown in FIG. 15. When coding the least significant bit the parent is assumed to have another bit below the actual least significant bit which is zero. If the reference bit of the parent coefficient is actually in a lower importance level than the current bit, the parent is assumed to be a zero head bit (the parent is not used).

16-bit Look-ahead

In the present invention, a look-ahead is used. This look-ahead is designed to reduce the redundancy of decisions coded by the coder. The determination of whether the look ahead is used is based solely on casual and deterministic data. If not, no data is coded and each coefficient is coded independently as described in the following sections. If the look-ahead is attempted and is successful, a zero bit is coded with a look-ahead context and the 16 coefficients are skipped. Otherwise, a one bit is coded with a look-ahead context and each coefficient is coded as described in the following description. (Note that a one bit can be coded even if the look-ahead was successful. This allows the encoder to bypass the look-ahead process.)

Figure 20:
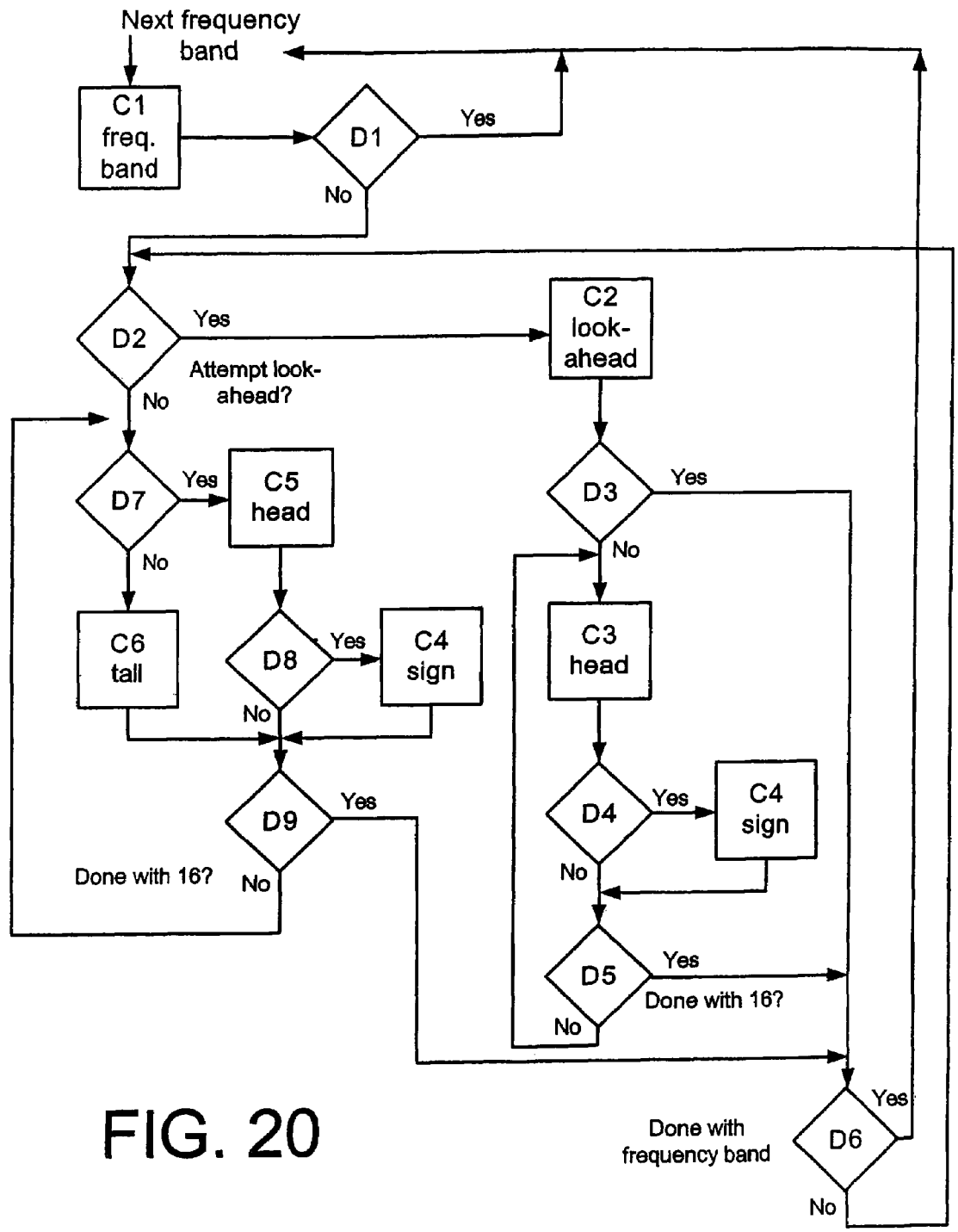
FIG. 20 is a flow chart for transform style context model.

In one embodiment, the decision to attempt the look-ahead depends on whether any one bits have been encountered in the 16 target coefficients (in child-based order), in the 4 parents of those coefficients, or in the 8 northern neighbors of those coefficients. The look-ahead is attempted if the reference bits in the parents, the reference bits in the northern neighbors, and bits in the previous bit-plane of the 16 target coefficients are all zero head bits. To clarify, not only are all the reference bits zero, but all bits more significant than the reference bits are zero. FIG. 16 shows these coefficients. At the edge of the tile or image, there may not be 16 target coefficients available in two rows; in this circumstance, no look-ahead is attempted. (Question D2 of the flow chart in FIG. 20 is answered no).

Note that if the parents are unavailable (due to alignment or nonexistence) or are not used then it is assumed that no one bits are ever encountered. In one embodiment, this consideration is also applied to the highest level DS, SD, and DD coefficients, because the SS coefficients are not used as parents. For these frequency bands, the parent is considered unavailable. Further, if there are no northern neighbors (e.g., the first line of the tile), then it is assumed that these unavailable bits are zero.

If the decision is to proceed with the look-ahead, the 16 bits of the current bit-plane of the target coefficients are examined to see if they are all zero head bits. If so, then a zero bit is coded with a context that consists of the last look-ahead attempted in the current frequency band at the current importance level. If this is the first look-ahead attempted in the current frequency band at the current importance level, then it is assumed that previous look-ahead was successful (assumes a zero was coded previously). If the 16 bits are not all zero head bits, a one bit is coded with the same context. It should be noted that other numbers of coefficients other than 16 may be used, such as 8 or 32. Other selections may be based on available memory or may be based on the location of reference bits that are not zero head bits.

Post Look-ahead

If the look ahead is attempted and fails, or is not attempted, the 16 (or fewer) bits are coded individually. Each coefficient has head bits decoded until the first one bit occurs, then the sign bit is coded immediately thereafter. After that, the coefficient is in the tail.

The coding is similar for the two cases: 1) look-ahead failed, 2) look-ahead not attempted. However, in one embodiment, different contexts are used, and in the first case, it is known that all coefficients to be decoded are head bits.

Post Look-ahead Head Bit Context Model

If the look-ahead is attempted and fails, then a few facts are known. First, the parent and northern neighbor coefficients of the top 8 are all in the zero head state. Second, so are all the target coefficients. Finally, there is at least 1 one bit among the target bits. Because this information is so different from not attempting the look-ahead, different contexts are used for coding these head bits. Thus, a different context model is used for these bits so as not to combine very different statistics.

Figure 17:
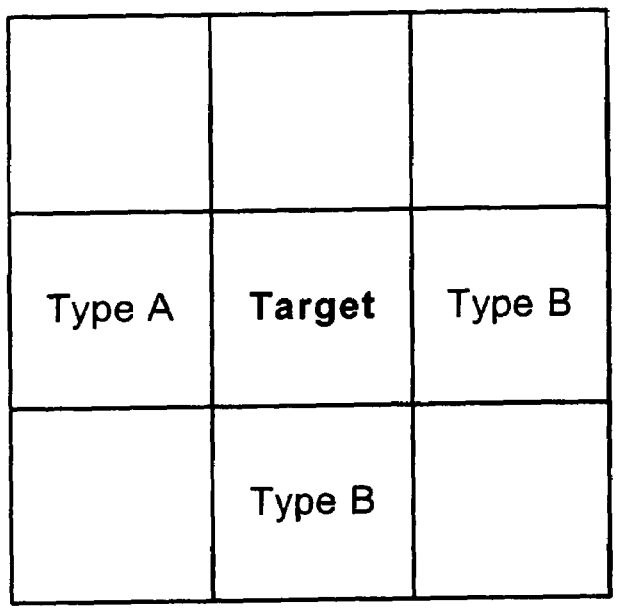
FIG. 17 illustrates post look ahead head bit context model neighborhood coefficient contribution.

To form the context model, certain values are derived from the neighboring pixels. It is clear that only some information from the parent and nearest neighbor coefficients can be used because, otherwise, the context model would be prohibitively large. Table 4 shows the types of information used from each coefficient. FIG. 17 shows the contributions of the neighborhood coefficients.

TABLE 4

Coefficient context information

| Definition | Type A | Type B |
| --- | --- | --- |
| Reference bit is a 0 head bit | 00 | 0 |
| Reference bit is the head bit with a value 1 | 01 | 1 |
| Reference bit is the first or second tail bit | 10 | 1 |
| Reference bit is a tail bit after the second tail bit | 11 | 1 |

The present invention takes special steps at tile boundaries. In one embodiment, if there are fewer than 16 coefficients (8 columns), then no look-ahead is attempted. Also, if there is only one line at the bottom of a tile, then no look-ahead is attempted.

Head Bit Context Model When Look-ahead Not Attempted

The bits in the importance level are coded in the frequency band order defined. Within each frequency band, the bits are coded in child-based order. The head bit context model portion of the transform-style context model depends on two sources of information:

the parent coefficient, if signaled, 2 bits, the nearest neighboring coefficients, 7 bits, These 9 bits form a unique number that signals a particular state called a context. This context is delivered to the FSM coder and is used to adapt the probability estimate for coding. Clearly, the information used for this context is casual; that is it is available at the time of decoding. It is also clear that only some information from the parent and nearest neighbor coefficients can be used. Table 4 shows the types of information used from each coefficient.

Figure 18:
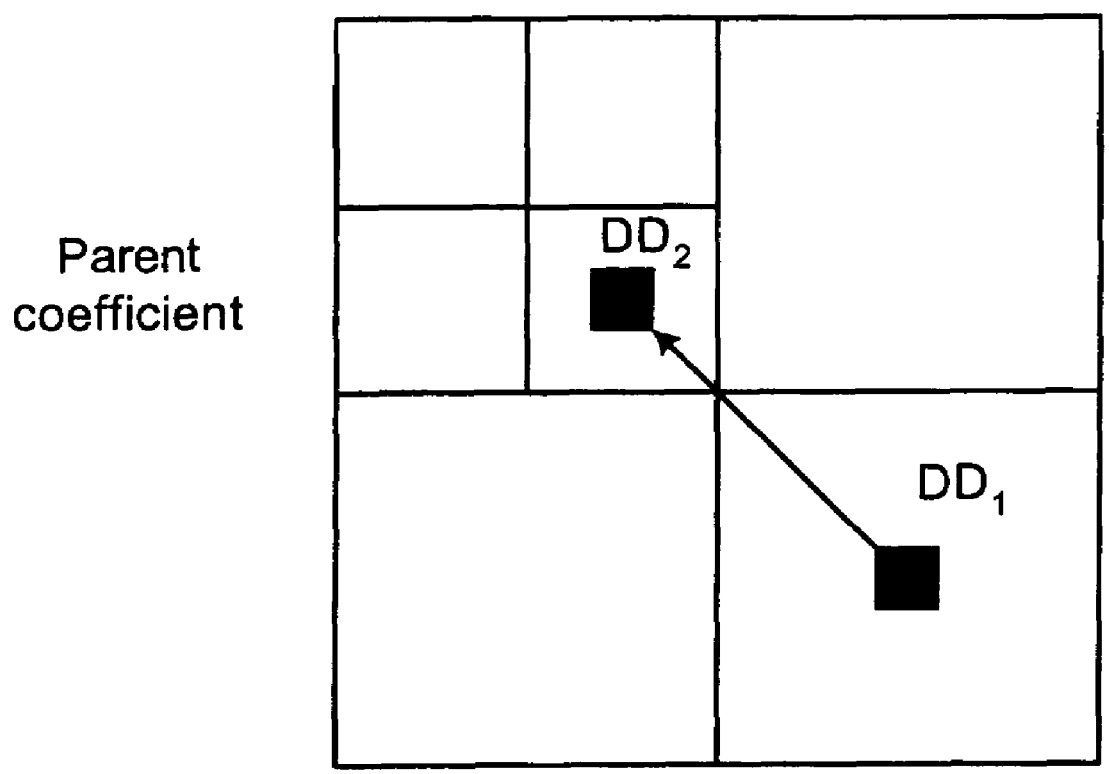
FIG. 18 illustrates an example of a parent coefficient and bit plane.

When used the parent coefficient contributes 2 bits to the context (type A information in Table 4). The parent coefficient is defined as the coefficient one transform level up (in the same frequency band) that covers the same spatial area. Coefficients in the highest level of each frequency band do not have a parent (SS coefficients are not used as parents), and the contribution is defined to be 0. FIG. 18 shows an example of a parent.

In the case where lower transform level coefficients are aligned such that the reference bit in the parent is below the current bit, the parent is not used for the context (the 2 bit contribution to the context is always zero). Also, the parent can be signaled as unused, which is useful for truly random access into the frequency bands of a coefficient. Also, coefficients that do not have parents do not use parents.

The contributions to the context from the neighbor coefficients are shown in FIG. 19. The types refer to Table 4.

Sign Bit Context Model

The sign bit of every coefficient is coded immediately after the last head bit (the first one bit) of that coefficient. The sign bit is part of the importance level that contains the last head bit. In one embodiment, the context for the sign bit is different from the head bit context and the tail bit context, consisting of three states based on the current sign bit value of the north neighboring coefficient. If there is no northern neighbor, the sign is unknown. The last head bit and the sign bit should be considered an atomic unit. Table 5 shows the context used for the sign bits. The same sign bit contexts are used whether the sign bit is being coded after a head bit or a post look-ahead head bit.

TABLE 5

Sign bit context information

| Definition | Bits |
|---|---|
| Sign of north coefficient is unknown | 0 |
| Sign of north coefficient is positive | 1 |
| Sign of north coefficient is negative | 2 |

Tail Bit Context Model

The tail bit context model is different from the head or sign bit context models. It consists of three states based on how many tail bits there have been in the current coefficient. Table 6 shows these values.

TABLE 6

Tail bit context information

| Definition | Bits |
|---|---|
| Reference bit is 1st tail bit | 0 |
| Reference bit is second or third tail bit | 1 |
| Reference bit is more than third tail bit | 2 |

Steps For Modeling Each Frequency Band Bit-plane

One embodiment of the process for modeling each bit-plane of each frequency band of each importance level can be viewed graphically in FIG. 20. The decisions made are in Table 7 and the bits and context sent to the coder are in Table 8. In one embodiment, there are a total of 5 independent contexts.

TABLE 7

Decisions in the context model flow chart

| Decision | Question |
|---|---|
| D1 | Are all the target bits in the frequency band zero? |
| D2 | Are there 16 coefficients left in the current two rows and if so, are the 4 parents, and 8 northern neighbors zero head bits in the current bit-plane, and the 16 target coefficient bits zero head bits in the previous bit-plane? |
| D3 | Are the 16 target bits zero head bits in the current bit-plane? |
| D4 | Was the head bit just coded a one bit? |
| D5 | Has the end of the 16 bits or the lines been reached? |
| D6 | Has the end of the frequency band been reached? |
| D7 | Is the target bit a head bit? |
| D8 | Was the head bit just coded a one bit? |
| D9 | Have the end of the 16 bits or the lines been reached? |

TABLE 8

Coding in the context model flow chart

| Code | Bit to code | Context |
|---|---|---|
| C1 | All bits==0?0:1 | Frequency band (1 context) |
| C2 | All bits==0?0:1 | Look-ahead (2 contexts) previous look-ahead result previous C2 bit coded (1 bit) |
| C3 | target bit | Post look-ahead bit (16 contexts) neighbor information (4 bits) |
| C4 | sign bit | Sign bit (3 contexts) northern neighbor sign bit (1 bit) or unknown |
| C5 | target bit | Head bit (512 contexts) parent into (2 bits) neighbor information (7 bits) |
| C6 | target bits | Tail bit (3 contexts) target coefficient information (depth into tail) (2 bits) |

An alternative embodiment of a context model, including an embodiment of a sign/magnitude unit that converts input coefficients into a sign/magnitude format, is described in U.S. patent application Ser. No. 08/498,695, filed Jun. 30, 1995 and entitled "Method and Apparatus For Compression Using Reversible Wavelet Transforms and an Embedded Codestream" and U.S. patent application Ser. No. 08/498,036, filed Jun. 30, 1995 and entitled "Reversible Wavelet Transform and Embedded Codestream Manipulation" and also U.S. patent application Ser. No. 08/642,518, filed May 3, 1996 and entitled "Compression and Decompression with Wavelet Style and Binary Style Including Quantization by Device-Dependent Parser" and U.S. patent application Ser. No. 08/643,268, filed May 3, 1996 and entitled "Compression/Decompression Using Reversible Embedded Wavelets".

The context model provides contexts for entropy coding of the data. In one embodiment, all the entropy coding performed by the present invention is performed by binary entropy coders. A single coder may be used to produce a single output code stream. Alternately, multiple (physical or virtual) coders may be employed to produce multiple (physical or virtual) data streams.

Binary-style Context Model

Figure 36:
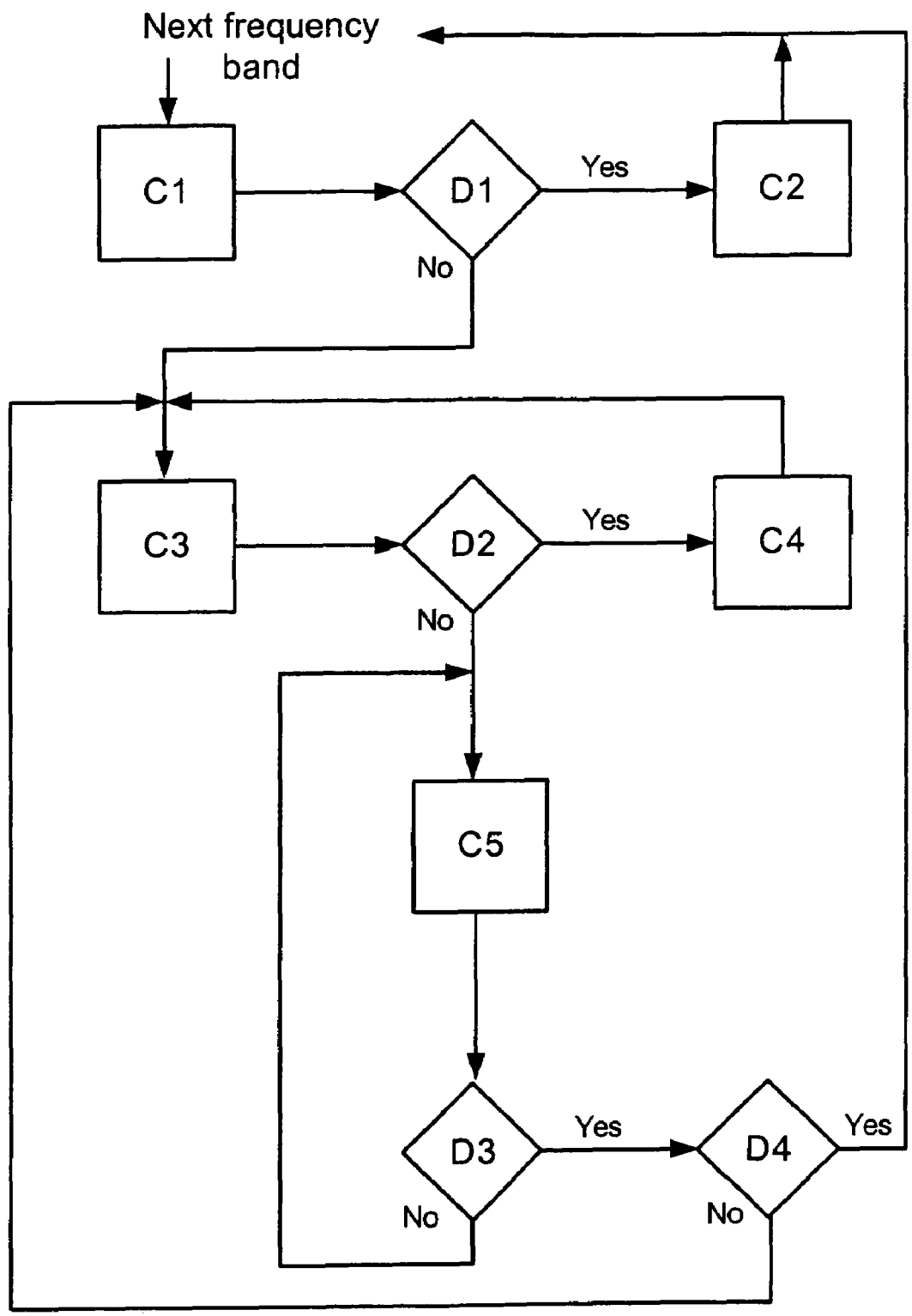
FIG. 36 is a flow diagram of one embodiment of the binary-style context model.

The modeling for the binary-style is similar to the transform-style context model. Among the differences, however, is that the binary-style coefficients are unsigned numbers: there is no sign bit or distinction between head and tail. FIG. 36 shows the flow of this context model.

Frequency Band Bit-plane Look-ahead

The bits in the importance level are coded in the frequency band order defined above. When coding a bit-plane of a frequency band (possibly part of an importance level) is coded, the first output bit of the context model determines whether or not the entire bit-plane is the same. If all bits are the same, then a 1 bit is delivered to the entropy coder; otherwise, a 0 bit is coded. Then, one bit is delivered to the entropy coder, indicating what that one bit is: 0 or 1. There is a separate context for frequency band bit-plane look-ahead, and a context for the value of the bit. The coder proceeds to the next frequency band bit-plane.

If there are two different bits, then a 1 bit is delivered to the entropy coder and the bit-plane is coded as described below. Note that a 1 can be is delivered to the entropy coder even if the bit-plane is constant. In this case, the bit-plane is coded as described below. This bit signaling the look-ahead is required for every frequency band bit-plane.

16-bit Look-ahead

This 16 bit look-ahead checks whether the next 16 bits (in the same line) are all the same; if so, a 0 bit is delivered to the entropy coder. Then a 0 or 1 is delivered to indicate which bit the bits were the same as. There is a separate context for N bit look-ahead. If, at the end of a frequency band, fewer than 16 bits remain, those remaining bits are treated in this same manner. If all of these conditions are not true, a 1 bit is delivered to the entropy coder.

Spatial Context Model

The bits in the importance level are coded in the frequency band order defined above. Within each frequency band, the bits are coded in raster order. The context model depends on 7 neighboring pixels within the same frequency band.

One bit from each of these pixels forms a unique number that signals a particular state called a context. This context is delivered to the FSM coder and is used to adapt the probability estimate for coding. The information used for this context is causal; it is available at the time of decoding.

The diamonds from FIG. 36 are described in Table 9.

TABLE 9

Decisions in the context model flow chart

| Decision | Question | Description |
|---|---|---|
| D1 | Are all the target bits (bits being coded now) in the frequency band are the same? | |
| D2 | Are the 16 target bits in the current bit-plane the same? | |
| D3 | Have the end of the 16 bits or the lines been reached? | |
| D4 | Has the end of the frequency band been reached? | |

The coding boxes from FIG. 36 are described in Table 10.

TABLE 10

Coding in the context model flow chart

| Code | Bit to code | Context | Description |
|---|---|---|---|
| C1 | All bits==x?0:1 | Frequency band (1 context) | |
| C2 | x | Equivalent Bit (1 context) | |
| C3 | All bits==y?0:1 | Look-ahead (2 contexts) | |
| C4 | y | Equivalent Bit (if its the same, is it a 1 or 0) (1 context) | |
| C5 | target bit | Bit (128 contexts) 7 neighboring bits | |

Neighbor Coefficients

Figure 37:
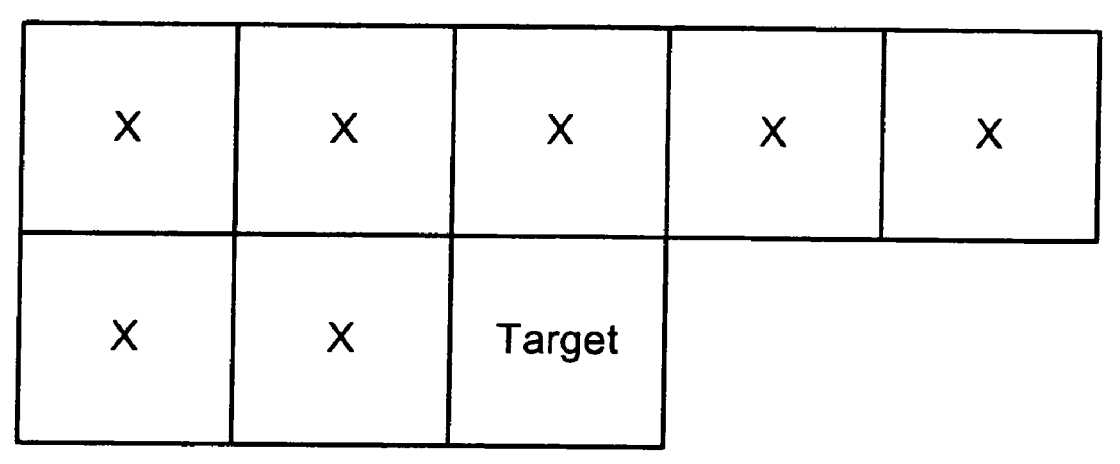

The neighbor coefficients that contribute to the context are shown in FIG. 37. Each contribution the bit value at that coefficient at the current bit-plane. Note that because each frequency band is a sub-sampling of the original images, the pixels used in the template will not be immediately adjacent in the original image.

The Encoding and Decoding Process of the Present Invention

Figure 21:
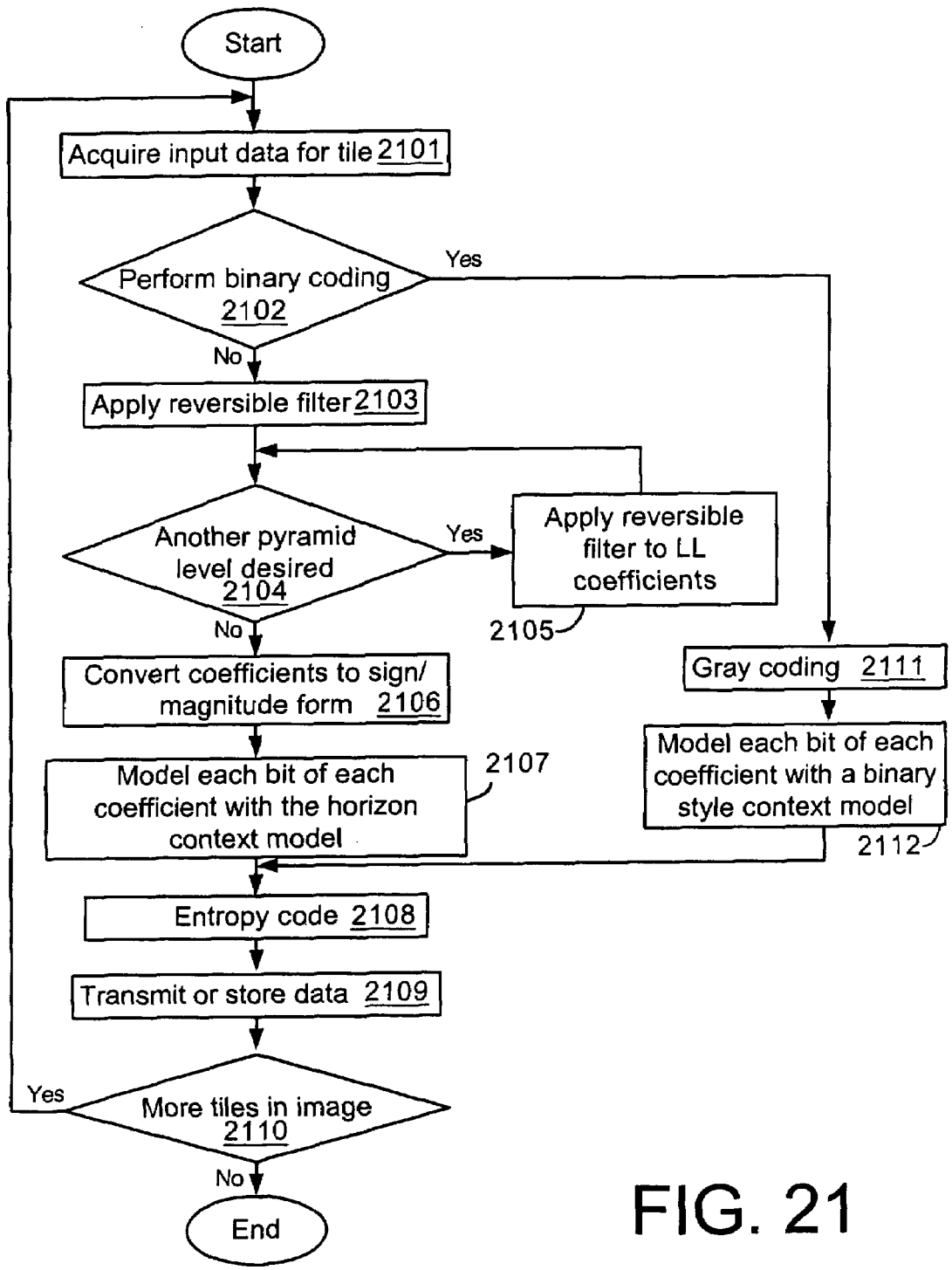
FIG. 21 is a flow chart of one embodiment of the decoding process of the present invention.

FIG. 21 illustrates one embodiment of the encoding process of the present invention. Referring to FIG. 21, the encoding process begins with processing logic acquiring input data for a tile (processing block 2101).

The processing logic then determines whether binary coding needs to be performed (processing block 2102). If binary coding is to be performed, the process continues to the processing block 2111 where the processing logic performs Gray coding on the input data, and models each bit of each coefficient with a binary style context model (processing block 2112). The processing continues to processing block 2108.

If binary coding is not to be performed, the process continues to processing block 2103 where the processing logic applies a reversible filter to the data. After applying the reversible filter, the processing logic tests whether there is another pyramid level desired (processing block 2104). If another pyramid level is desired, the processing logic applies the reversible filter to the LL coefficients (processing block 2105) and the processing moves back to a processing block 2104 where the test is repeated. If another level of decomposition is not desired, the process continues to processing block 2106 where the processing logic converts the coefficients to sign-magnitude form. Thereafter, the processing logic models each bit of each coefficient with the horizon context model (processing block 2107), and the process continues to processing block 2108.

At processing block 2108, the processing logic codes each bit of each coefficient. The processing logic then transmits and stores each decoded data (processing block 2109).

The processing logic then tests whether more tiles are used in the image (processing block 2110). If more tiles are in the image, the processing logic looks back to processing block 2101 and the process is repeated; otherwise, the process ends.

Figure 22:
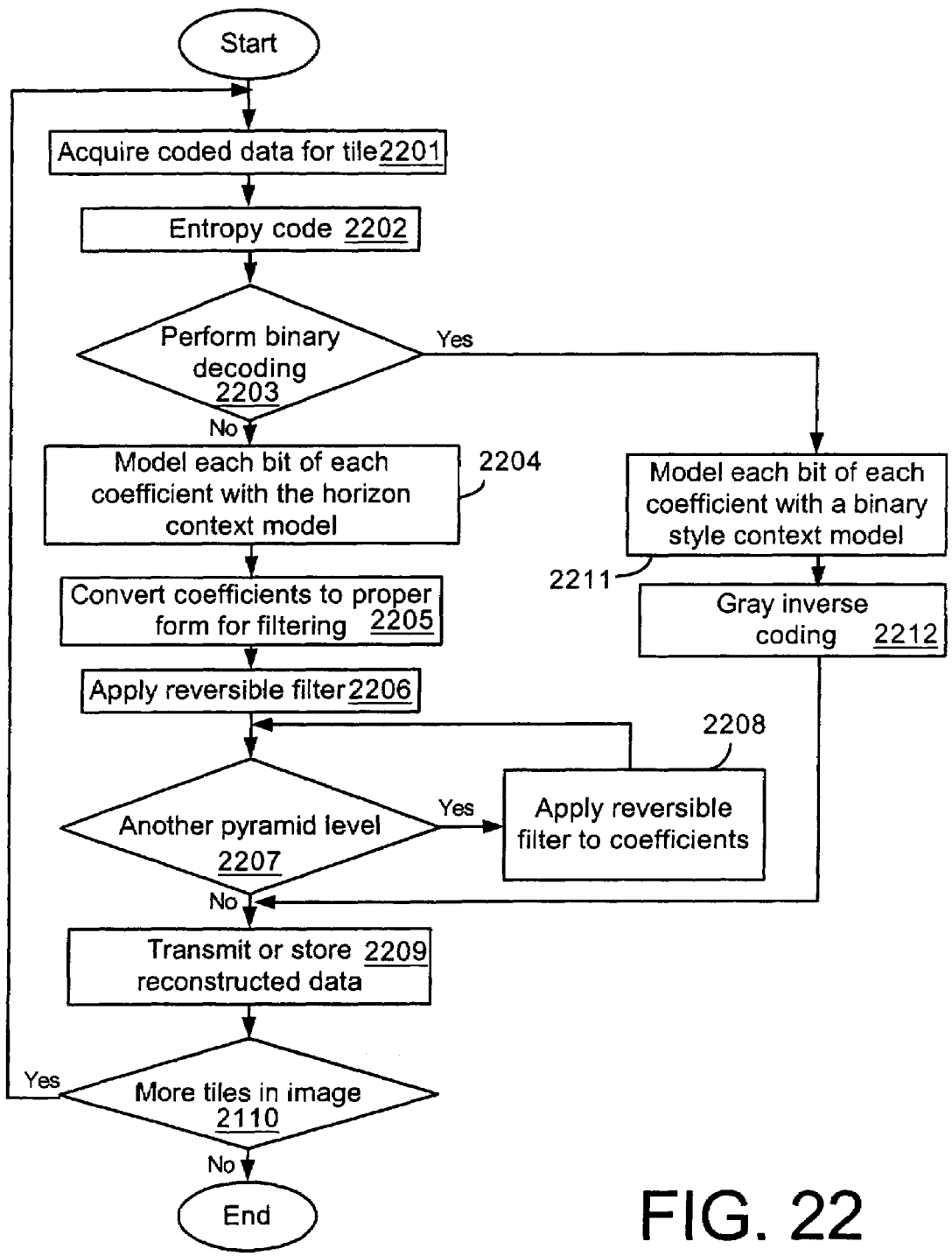
FIG. 22 is a flow chart of one embodiment of the decoding process of the present invention.

FIG. 22 illustrates one embodiment of the decoding process of the present invention. Referring to FIG. 22, the process begins by acquiring coded data for a tile (processing block 2201). Next, the processing logic entropy decodes the decoded data (processing block 2202). The processing logic then tests whether the data is to undergo binary decoding (processing block 2203). If the data is to undergo binary decoding each bits, the process continues to processing block 2211 where the processing logic models each bit of each coefficient with a binary style context model and performs inverse Gray coding on the data (processing block 2212). After the inverse Gray coding, the process continues to processing block 2209.

If binary decoding is not to be performed, and the process continues to processing block 2204 where the processing logic models each bit of each coefficient with the context model. Then, the processing logic converts each coefficient to the proper form for filtering (processing block 2205) and applies a reversible filter to the coefficient (processing block 2206).

After applying the reversible filter, the processing logic tests whether there is another pyramid level (processing block 2207). If there is another level of decomposition, the process continues to processing block 2208 where the processing logic applies a reversible filter to the coefficient and the process loops back at the processing block 2207. If another level of decomposition is not required, then the process continues to processing block 2209 where the reconstructed data is either transmitted or stored.

Next, the processing logic tests whether there are more tiles in the image (processing block 2210). If there are more tiles in the image, the processing loops back to processing block 2201 and then the process is repeated; otherwise the process ends.

Entropy Coding

In one embodiment, all the entropy coding performed by the present invention is performed by binary entropy coders. In one embodiment, entropy coder 104 comprises either a Q-coder, a QM-coder, a finite state machine coder, or a high speed parallel coder, etc. A single coder may be used to produce a single output code stream. Alternately, multiple (physical or virtual) coders may be employed to produce multiple (physical or virtual) data streams.

In one embodiment, the binary entropy coder of the present invention comprises a Q-coder. For more information on the Q-coder, see Pennebaker, W. B., et al., "An Overview of the Basic Principles of the Q-coder Adaptive Binary Arithmetic," *IBM Journal of Research and Development*, Vol. 32, pg. 717-26, 1988. In an alternate embodiment, a binary entropy coder uses a QM-coder, which is a well known and efficient binary entropy coder. It is particularly efficient on bits with very high probability skew. The QM-coder is used in both the JPEG and JBIG standards.

The binary entropy coder may comprise a finite state machine (FSM) coder. Such a coder provides the simple conversion from a probability and an outcome to a compressed bit stream. In one embodiment, a finite state machine coder is implemented using table look-ups for both decoder and encoder. A variety of probability estimation methods may be used with such a finite state machine coder. Compression is excellent for probabilities close to 0.5. Compression for highly skewed probabilities depends on the size of the lookup table used. Like the QM-coder, it is useful with embedded bit streams because the decisions are coded in the order of occurrence. There is no possibility for "carry-over" problems because the outputs are defined by a lookup table. In fact, there is a maximum delay between encoding and the production of a compressed output bit, unlike the Q and QM coders. In one embodiment, the finite state machine coder of the present invention comprises a B-coder described in U.S. Pat. No. 5,272,478, entitled "Method and Apparatus for Entropy Coding", issued Dec. 21, 1993. In another embodiment, the finite state machine coder comprises a coder described in U.S. patent application Ser. No. 08/719,819, entitled "Apparatus and Method for Performing M-ARY Finite State Machine Entropy Encoding," filed Sep. 26, 1996.

In one embodiment, the binary entropy coder of the present invention comprises a high speed parallel coder. Both the QM-coder and the FSM coder require that one bit be encoded or decoded at a time. The high-speed parallel coder handles several bits in parallel. In one embodiment, the high speed parallel coder is implemented in VLSI hardware or multi-processor computers without sacrificing compression performance. One embodiment of a high speed parallel coder that may be used in the present invention is described in U.S. Pat. No. 5,381,145, entitled "Method and Apparatus for Parallel Decoding and Encoding of Data", issued Jan. 10, 1995.

Most efficient binary entropy coders are limited in speed by fundamental feedback loops. A possible solution is to divide the incoming data stream into multiple streams and feed these to parallel encoders. The output of the encoders are multiple streams of variable-length coded data. One problem with this type of approach is how to transmit the data on a single channel. The high speed parallel coder described in U.S. Pat. No. 5,381,145 solves this problem with a method of interleaving these coded data streams.

Many of the contexts used in the present invention are fixed probability, which makes a finite state machine coder, such as the B-coder especially useful. Note when a system using probabilities close to 0.5, both high speed parallel coder disclosed above and the finite state machine coder operate with more efficiency than the Q-coder. Thus, both have a potential compression advantage with the context model of the present invention.

In another embodiment, both a binary entropy coder and a fast m-ary coder are used. The fast m-ary coder may be a Huffman coder.

Lossy Compression Reconstruction

Lossy Coefficient Reconstruction

Figure 23:
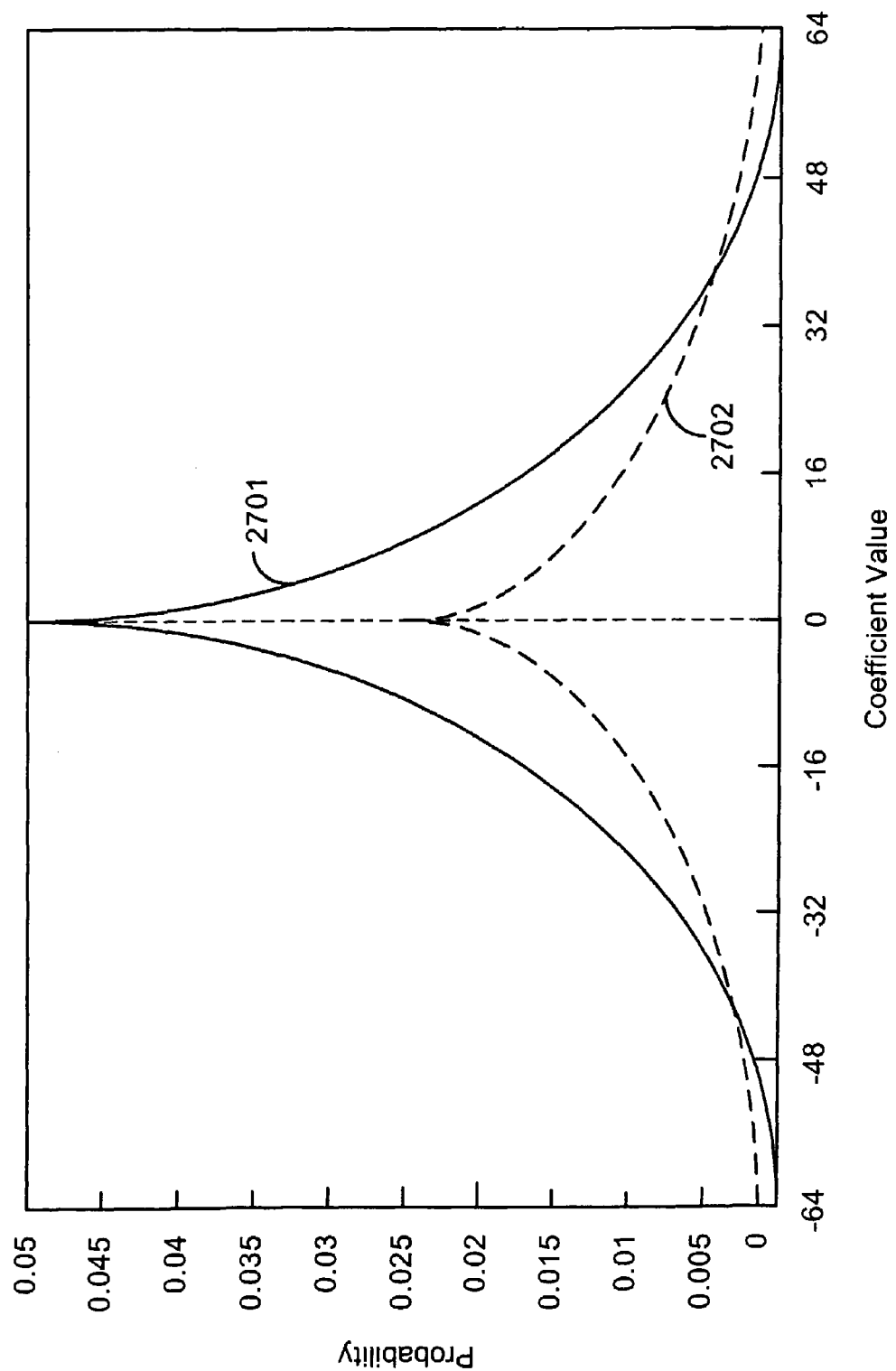
FIG. 23 illustrates a typical distribution for lossy reconstruction.

After coefficients have been quantized, there is a range of numbers within the legitimate reconstruction values. In such a case, the lower order (or bottom) bits of a coefficient are typically unknown and bit values for these lower order bits must be assigned. In one embodiment, the present invention performs lossy reconstruction of the quantized values by truncating values to a predetermined set of integer values. For instance, in one embodiment, all coefficients between 0 and 31 are quantized to 0, all coefficients between 32 and 63 are quantized to 32, and so on. Thus, in this case, all of the unknown bits of the coefficients are replaced with all zeros. FIG. 23 illustrates a typical distributions of coefficients without quantization.

In another embodiment, a value in the middle of each region may provide a more accurate value to represent the group of coefficients. For instance, all coefficients between 64 and 127 are quantized to 96 (or alternatively, 95). The point to which the values are quantized is referred to as the reconstruction point.

In still another embodiment, the value 0.375 (⅜) from the lower bound of each region may be used. For instance, all coefficients between 64 and 127 have a reconstruction point of 88. Any value may be selected based on the specific image(s), distribution of data, desired result, or other criteria.

Due to the difference between images, the resulting distributions might have skewed shapes. For instance, compare curves 2701 and 2702 in FIG. 23.

In the present invention, the reconstruction point is selected based on the distribution. In one embodiment, the distribution is estimated and, based on that estimate, a reconstruction point is chosen. The estimate is generated based on the data that is already known. In one embodiment, a histogram of quantized coefficients may be used to make a prediction.

The variance in the distribution may be determined during encoding. By providing this variance to the decoder during decoding, a better prediction may be made for selecting a reconstruction value. A single variance may be used for all quantized coefficients in a frequency band. In one embodiment, the variance is signaled to the decoder. Such signaling may be by a separate signal or by providing the variance in a tag, such as a comment tag.

Note that the selection of the reconstruction point could inject noise into the non-zero coefficients. Depending on what reconstruction point is selected, different amounts of energy may be injected into the image. In one embodiment, different reconstruction points are used for different pyramid levels or different subbands.

In one embodiment, prior to gathering data, a default reconstruction point may be used. Thus, the present invention provides an adaptive method of performing lossy reconstruction. Further, the present invention is a non-iterated method of improving the coefficient reconstruction.

To compensate for the non-uniform usage of the numeric range due to different distributions, the present invention provides for $$s^2 = \text{sample variance}$$

$$Q = \text{Quantization}$$

$$\sigma^2 = \frac{2}{\alpha^2} = \text{True variance}$$

$$\alpha = -\frac{1}{Q}\ln\left[\frac{Q^2 + 2s^2 - \sqrt{Q^4 + 8Q^2s^2}}{2(s^2 - Q^2)}\right]$$

where $S^2$ is the sample variance measured by the decoder based on the data available and Q is the quantization which is known to the decoder. Then correct non-zero coefficients by moving them away from 0

$$iQ \to iQ + \left[\frac{1}{\alpha} - \frac{Q}{e^{\alpha Q} - 1}\right] \quad i > 0$$

$$iQ \to +iQ - \left[\frac{1}{\alpha} - \frac{Q}{e^{\alpha Q} - 1}\right] \quad i < 0$$

where i equals any integer.

In one embodiment, after all decoding is completed, every non-zero coefficient is adjusted to a reconstruction level. This requires reading, and perhaps modifying and writing each coefficient.

In another embodiment, as each bitplane of each coefficient is processed, if the coefficient is non-zero, the proper reconstruction value of the coefficient is stored. When decoding stops, all coefficients are already set to their proper reconstruction value. This eliminates the need for a separate pass though the memory for setting reconstruction levels.

Noise Injection

The present invention provides for injecting noise into data being decoded. In one embodiment, the data being decoded is image data that has been quantized. In one embodiment, the quantized image data comprises quantized coefficients. Quantization of wavelet coefficients is essentially a low pass operation. For instance, the data may be quantized when only a portion of the data is decoded. Performing low pass filtering on image data is acceptable unless texture is destroyed. The feel of this texture may be recaptured by injecting noise. Thus, the present invention injects noise into the an image as a function of the quantization.

In one embodiment, noise is injected into the image using only the zero quantized coefficients. A random value may be added to the zero quantized coefficients. The zero quantized coefficient may be represented as a series of zero bits followed by a certain number of unknown bits. These unknown bits are reconstructed by the addition of random values. If these are four bits of unknown data, they may be replaced with a number from 0 to 15. The higher the number, the greater the noise. The unknown bits are magnitude bits. The sign bit may also be randomly chosen, resulting in coefficients between −15 and 15.

Note that the added noise in level 1 transform DD coefficients only affects four pixel values due to the reversible wavelet transform of the present invention. Therefore, the result of injecting noise does not cause noticeable artifacts with the neighboring pixels.

In one embodiment, noise is not injected into each of the zero quantized coefficients. For example, noise may only be injected into the pyramid level 1 DD coefficients. In another embodiment, noise is only injected into pyramid level 1 DS and SD coefficients.

In an alternate embodiment, the noise is a function of the noise in the original image. In order to inject noise as a function of the noise in the original image, the noise in the original image is quantified and provided to the decoder. In one embodiment, a spatial map is made that illustrates the energy distribution. In one embodiment, the distribution, amplitude and deviation of the noise in the original image are signaled to the decoder. This information may be signaled to the decoder using a tag in the codestream or using separate signals or a separate information path.

In an alternative embodiment, an alpha plane may be made showing where the noise should be placed. The alpha plane could be used in a manner similar to that of a blending plane where the plane would indicate different locations in the image where different amounts of noise are to be injected. That is, at one location (e.g., region) the plane may specify noise of a first type to be injected, while another location in the alpha plane could indicate that a different amount of noise is to be injected.

The noise that is added may be based on a distribution of values within the region surrounding 0. If the distribution of values is offset and not centered around the 0 value, a bias may have to be added (or subtracted) as well as the noise.

Detiling and Deringing

The Two, Ten-Transform allows for some advantages in reconstruction after lossy compression. To reiterate, the Two, Ten-Transform is defined as follows:

$$S_n = \lfloor (X_{2n} + X_{2n+1})/2 \rfloor$$

$$B_n = X_{2n} - X_{2n+1}$$

$$P_n = (3S_{n-2} - 22S_{n-1} + 22S_{n+1} - 3S_{n+2} + 32)/64$$

$$D_n = B_n + P_n$$

$$X_{2n} = S_n + \lfloor (D_n - P_n + 1)/2 \rfloor \text{ or } S_n + \lfloor (B_n + 1)/2 \rfloor$$

$$X_{2n+1} = S_n - \lfloor (D_n - P_n)/2 \rfloor \text{ or } S_n - \lfloor B_n/2 \rfloor$$

In one embodiment, for lossy compression, D is quantized. For creating preferred reconstructions, in some cases, D values are computed directly. In other cases, a preferred B value is determined, which is then converted to a D value using P if necessary.

New Order for Two-Pass Inverse Transform

Figure 24:
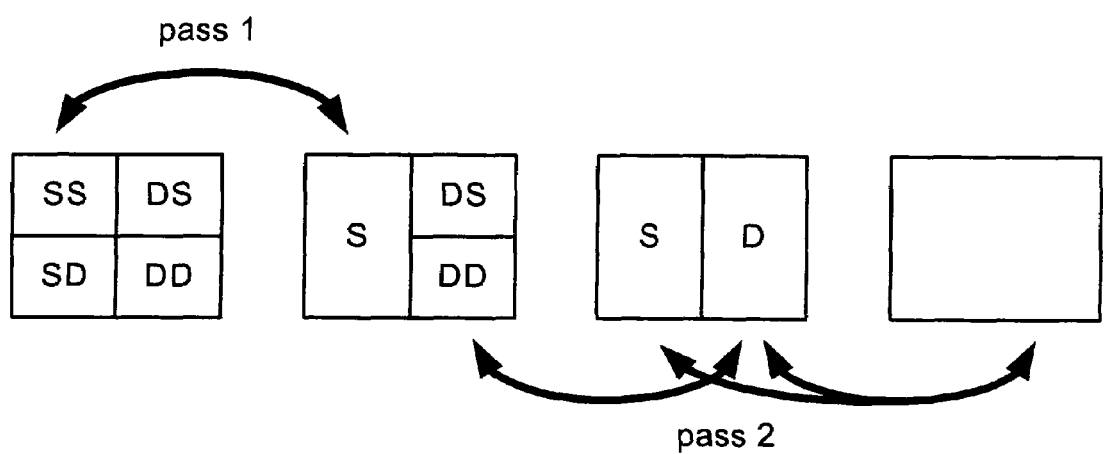
FIG. 24 illustrates a method for computing the inverse TT-transform.

FIG. 24 illustrates a method for computing the inverse TT-transform that is useful when using adaptive wavelet coefficient reconstruction. The output of each of two passes are S coefficients. In one embodiment, the S coefficients are samples of images (pixel components). In an alternative embodiment, the S coefficients are averages of multiple samples of the image ("super pixel components"). The S components can be treated as image data in the spatial domain, allowing preferred reconstructions to be generated.

Preferred reconstructions are based on an image model. An image model might provide for sharp edges and smooth regions where there are not edges. An image model might provide texture information. An image model might be image independent or described with the compressed for a specific image. Image models will be described below. The use of the two-pass inverse transform of the present invention reduces the need to save intermediate results to compute the transform and determine quantization limits. In other words, the SS and SD coefficients consumed by the first pass do not have to be saved.

Referring to FIG. 24, the two-pass inverse transform process of the present invention begins with the first pass, pass 1, performing the inverse vertical transform on the SS and SD coefficients only. The quantization of each SD coefficient controls the reconstruction limits of two samples. The second pass, pass 2, operates on two lines of coefficients at a time and performs the inverse vertical transform on DS and DD coefficients and the inverse horizontal transform for two vertically adjacent S and D coefficient pairs. The second pass continues until all the lines of the data undergo the two inverse transform operations of the second pass. Note that the quanization of the DS and DD coefficients controls the reconstruction limits of four samples. Also, for the second pass, the DS coefficients from two above lines are for computing the vertical inverse transform on DS and DD coefficients.

Reconstruction and Clipping

One embodiment of a procedure for creating a preferred reconstruction is as follows.

```
Analyze the coefficients and/or normal reconstruction (Optional)
FOR transform level = max_level DOWNTO 1
    FOR each subband DO
        FOR each SD coefficient DO
            Compute prefered reconstruction
            Clip to be consistent with quantization
        Do pass 1 of inverse transform
        FOR each DS and DD coefficient pair DO
            Compute prefered reconstruction
            Clip to be consistent with quantization
        Do pass 2 of inverse transform
```

The first step of analyzing the coefficients is used when the preferred reconstruction is estimated from the coefficients. An example of this is discussed in conjunction with edge extraction below.

Clipping is an operation in which a particular value is set to a value in a range (or one of the end points of the range) when the value is outside the range. Clipping is necessary to assure that the reconstructed image results in the same quantized coefficients as specified in the coded data. For a given quantized coefficient value D which was Q bits that are unknown to quantization, the present invention determines the minimum and maximum possible values of D which are used to clip preferred reconstructions, when necessary. One embodiment of the following code may be used to calculate minimum and maximum values.

```
inline void twoten: :q_to_minmax (int d, int q)
{
    int n = (1<<q) -1;
    if (d ==0) {
        min = -n;
        max = n;
    } else if (d>0) {
        min = d & (-n);
        max = d | n;
    } else {
        max = -((-d) & (-n));
        min = -((-d) | n);
    }
}
```

In the exemplary code above, the "&" refers to logical ANDing operation and the "|" refers to a logical ORing. For clipping D values, the clipping routine, "clip" described below may be used. The "clip" routine is useful for SD and DS. In one embodiment, the "clip" routine described may also be used for DD coefficients; however, in an alternative embodiment, a routine such as "clip_loose" may be better to allow some off-by-one errors to compensate for the independent clipping of related DS and DD values. Note that the clip-loose routine calls the "clip" routine. The "flat" parameter is the value of D that results in both samples being reconstructed as identical, i.e., it is the "P" portion of the TT-transform. Due to different integer rounding, off-by-one errors that result in both samples reconstructed as identical are permitted.

```
inline int twoten:: clip (int n, int min, int max)
{
    if (n < min)
        return min;
    if (n> max)
        return max;
    return n;
}
inline int twoten:: clip_loose (int n, int min, int max, int flat)
{
    if (min-1 == flat)
        return clip (n, flat, max);
    else if (max+1 == flat);
        return clip (n, min, flat);
    else
        return clip (n, min, max);
}
```

For DS and DD values, preferred reconstruction values are usually determined as a pair of "d" values. The "do_clip_pair" routine below clips two D values, "a" and "b", resulting in "a_clip" and "b_clip". Note that the routine calls the clip-loose routine.

```
inline void twoten::do_clip_pair Itwoten *tt_0ds, towten *tt_1dd, int vert_p)
{
    int a;
    int b;
    int s;
    int d;
    int s_clip;
    int d_clip;
    int a_clip;
    int b_clip;
    a = tt_0ds->d( );
    b = tt_1dd->d( );
    s = s_calc(a,b);
    d = a - b + vert_p;
    s_clip = clip_loose (s, tt_0ds->get_min( ), tt_0ds->get_max( ), vert_p);
    d_clip = clip_loose (d, tt_1dd->get_min( ), tt_1dd->get_max( ), vert_p);
    a_clip = inverse_calc0 (s_clip, d_clip, vert_p);
    b_clip = inverse_calc1 (s_clip, d_clip, vert_p);
}
```

An embodiment of the inverse_calc0 and inverse_calc1 routines are as follows:

```
inline int s_calc (int s0, int s1) (return (s0+s1) >> 1: };
inline int twoten::inverse_calc0(int s, int d, int p)
{
    return s + ((d - p + 1) >>1);
}
inline int twoten::inverse_calc1 (int s, int d, int p)
{
    return s - ((d - p) >> 1);
}
```

Note that one of these routines is for the even samples and one is for the odd samples.

Reconstruction for Tile Boundaries

The present invention creates preferred reconstructions to eliminate tile boundaries. The present invention creates preferred reconstructions by using information from the neighboring tiles to generate a reconstruction that would be consistent with performing the transform without tile boundaries.

In one embodiment, with preferred reconstruction, the forward transform is performed independently on each tile. During decoding, it is a user/application choice to decide to decode, reconstruct an inverse transform independently or not.

The TT-transform wavelet allows reconstruction to maintain the advantages of an overlapped transform even when tiles of an image are transformed independently. When the TT-transform is performed independently on tiles of an image, the tile boundary artifacts can be easily removed.

Tile boundaries artifacts can be readily eliminated from TT-transform coefficients because of the following reasons. The TT-low pass filter is unaffected by boundaries when there is an even number of samples, leading to accurate S coefficients. D coefficients, which are affected by boundaries, only have limited spatial effect. Note that smoothness is defined to be having a zero high pass filter response when the filter is applied crossing the boundary. Therefore, smoothing may be performed easily in the transform domain and easily limited to the amount allowed by the quantization.

In one embodiment, the present invention eliminates tile artifacts by reconstructing before each application of the transform. Exemplary code to eliminate tile artifacts is as follows:

```
for (level=levels; level > 0; level--)
    save DS and DD coefficients effected by boundary
    reconstruct SD coefficients to be smooth across boundary
    for each tile
        vertical inverse transform on tile
    reconstruct D coefficients to be smooth across boundary
    for each tile
        horizontal inverse transform on tile
```

The P portion of the inverse TS-filter that is a function of S coefficients and is given below:

$$P=(3S_{-2}-22S_{-1}+22S_1-3S_2+32)/64.$$

FIG. 25 shows the weights used to compute $P_f$ across tile boundaries (full-frame). FIG. 26 shows the weights used to compute $P_t$ on a single tile boundary with mirroring. Tile boundary artifacts are caused by the difference between $P_t$ and $P_f$. By using $D=-(P_f-P_t)$, a smooth result is obtained, which must be consistent with the actual quantized coefficients.

The SD coefficient may be made consistent with the quantization, since the quantization is known. First, the present invention determines the minimum and maximum allowed values from the quantized SD value, given that the number of bit planes quantized Q bits are unknown. As described above, the minimum and maximum values may be determined according to the following code:

```
N = (1 << Q) -1
if (DS == 0) (
    MIN = -N;
    MAX = N;
} else if (DS > 0) {
    MIN = DS & (-N);
    MAX = DS | N;
} else {
    MAX = -((-DS) & (-N));
    MIN = -((-DS) | N);
}
```

The MIN and MAX values are used to clip the result obtained from computing $-(P_f-P_t)$.

```
compute Pf and Pt
SMOOTH = -(Pf-Pt)
if (SMOOTH < MIN)
    SD = MIN;
else (SMOOTH > MAX)
    SD = MAX
else
    SD = SMOOTH
```

The quantization of DS and DD coefficients is propagated through the vertical transform. Therefore, handling the horizontal transform is slightly more complicated. In order to do so, a pair of lines, denoted "a" and "b" that share DS and DD coefficients are considered at a time. These DS and DD values were saved prior to the inverse vertical transform; therefore, they are still available. The values after the transform are DA and DB. The minimum and maximum values for DS and DD (MIN_DS, MIN_DD, MAX_DS, MAX_DD) are computed in the same manner as the DS minimum and maximum values.

compute Pfa and Pta for first line computer Pfb and Ptb for second line $SMOOTHa=-(Pfa-Pta)$ $SMOOTHb=-(Pfb-Ptb)$ $S=(SMOOTHa=SMOOTHb)>>1;$ $P=DD-DA+DB;$ $D=(SMOOTHa-SMOOTHb)+P$ clip S using MIN_DS and MAX_DS clip D using MIN_DD and MAX_DD $DA=S+((D-P+1)>>1);$ $DB=S-((D-P)>>1);$ For images containing no high frequency information (all coefficients other than SS coefficients are zero), the reconstruction for any tiling (with an even number of samples for every pyramid level) is the same as for full frame.

Figure 27:
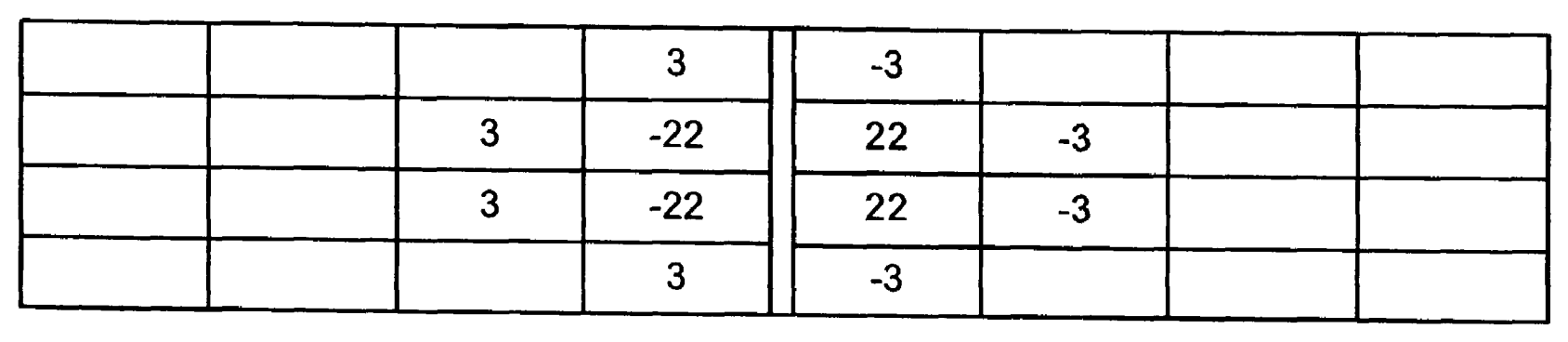

Because the reconstruction only effects a small number of total coefficients for reasonable tiles, neither the computation cost not the memory cost is very high. However, there are a number of simplifications that could be made to reduce these costs. FIG. 27 illustrates weights for calculating $P_f-P_t$ approximately. Off-by-one errors due to different integer rounding prevent obtaining exactly the same result as full frame on images with no high frequency, but should make no difference in practical applications. Another potential simplification is to approximate all S coefficients in other tiles with SS coefficients to reduce memory usage.

Because the TT-filter is lossless, tile artifact removal may be performed as post-processing. An image may be decompressed without tile artifact removal construction. The location of the tile boundaries and the quantization are saved for later use. When an image without tile artifacts is desired, the image may be transformed, and then using the information about tile locations and quantization, it can reconstructed without tile artifacts.

In many systems, simplifying decoding is important. The amount of information from neighboring tiles that is required for preferred reconstruction is small. That information could be stored in a comment with the coded data for each tile, allowing each tile to be decoded independently. Also, there is no requirement that every coefficient be given a preferred reconstruction. In one embodiment, only coefficients that were in certain transform levels or those which are quantized to zero may be given preferred reconstructions.

Reconstruction of Step Edges

Figure 28A:
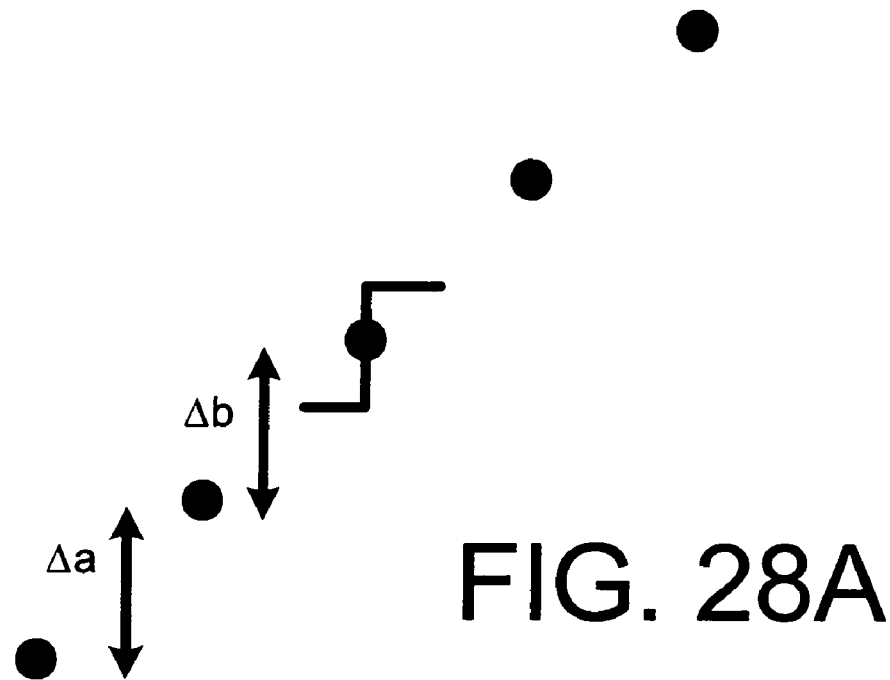
FIGS. 28 and 28B illustrate deciding linear reconstruction (FIG. 28A) or step edge reconstruction (FIG. 28B) using five S coefficients.
Figure 28B:
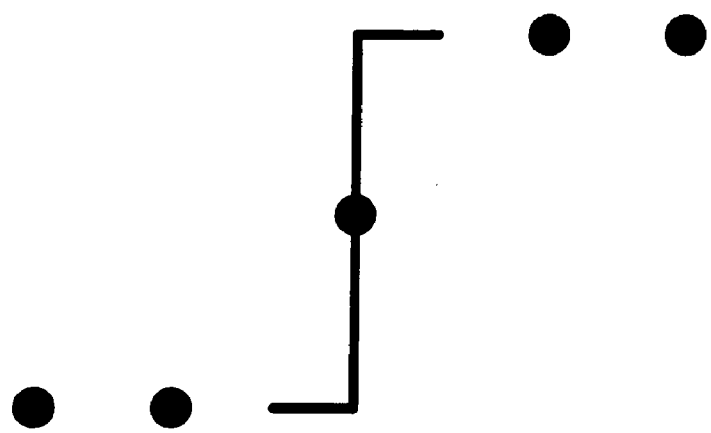

The present invention provides for reconstruction of step edges using a predetermined number of coefficients. In one embodiment, only S coefficients are used and the predetermined number is 5. FIGS. 28A and 28B illustrate examples sets of five S coefficients where reconstruction to linear (smooth) or step edges, respectively, is appropriate. The solid lines illustrate the step size of the preferred reconstruction.

One embodiment of the process for determining whether to perform linear reconstruction or step edge reconstruction is as follows. Note that in the process, a "B" value, the difference between two samples, is computed, and the coefficient, D, is equal to the addition of B+P.

The present invention attempts to reconstruct a step edge where the image is not flat. In one embodiment, if the minimum and maximum S values differ by less than 10, the present invention does not reconstruct a step edge. Note, in an alternative embodiment, a threshold of 10 need not be used and a different threshold may be used.

In reconstructing a step edge, the present invention computes the reconstruction B using the left three S values, referred to as "LEFT" and the reconstruction B using the right three S values, referred to as "RIGHT". If either the LEFT or RIGHT computation is zero, then the present invention reconstructs using B=zero and exits.

If both the LEFT and RIGHT computations have the same sign, the present invention uses the reconstruction with the smaller magnitude and exits. If also LEFT and RIGHT computations differ in sign, then present invention exits and a typical reconstruction is used.

In one embodiment, of the present invention, the calculation of the reconstruction B is performed by first determining the differences. The values Δa and Δb represent differences between the outer and inner pairs of S values. For example, see FIGS. 28A and 28B.

The present invention then tests whether |Δa|>|Δb|. If so, the present invention changes Δa to Δa=Δb.

There are two options to handle the case when Δa and Δb have different signs. The first option is to set Δa=0. The first option makes this case imply a hard edge. The second option is to set Δa=Δb. The second option makes this case imply smooth (normal) Two, Ten transform reconstruction.

Next, the present invention sets x=Δa/Δb. If the sign of Δa and Δb differ, the present invention sets B=2 Δb (1+x); otherwise, the present invention sets B=2 Δb(1-3¾x). Finally, for LEFT, the present invention returns B, while for RIGHT, the present invention returns −B.

For line art or graphic images where, all or at least most, edges are step edges, this reconstruction procedure of the present invention can be used for all transform levels. For natural images, this reconstruction can be used only for high frequency transform levels.

Matched Filter Reconstruction

The goal of reconstruction using matched filters is to not use information from the other side of edges. When an edge is found, the present invention uses symmetric extension on the other side of the edge. For example, one set of filter coefficients according to the present invention that can be used depending on whether or not an edge is found are as follows.

| 3  | −22 | 0   | 22 | −3  | no edge       |
| 0  | −13 | −9  | 25 | −3  | edge to left  |
| 0  | 0   | −48 | 64 | −16 | edge to left  |
| 3  | −25 | 9   | 13 | 0   | edge to right |
| 16 | −64 | 48  | 0  | 0   | edge to right |

The present invention may use the following matched filters to find edges in sets of five S coefficients. The order of these filters corresponds to the filters above.

| 1 | −4 | 4 | −4 | 1  |
| 0 | −1 | 3 | −3 | −1 |
| 0 | 0  | 2 | −3 | 1  |
| 1 | −3 | 3 | −1 | 0  |
| 1 | −3 | 2 | 0  | 0  |

In one embodiment, a filter coefficient set with extension is used if:
1) its corresponding matched filter has the minimum magnitude response.
2) its corresponding in matched filter response magnitude is less than a threshold. (for example, 48).
3) for a 4-tap matched filter, the corresponding 3-tap matched filter response magnitude must also be less than the threshold.

The matched filter reconstruction of the present invention may be performed on all frequency levels or just high frequency levels.

Edge Extraction

A goal of preferred reconstruction is to have sharp edges and to eliminate ringing near edges. In one embodiment, the present invention identifies where the edges in a reconstructed image are and then uses multiscale information from different amounts of Gaussian smoothing.

Figure 29:
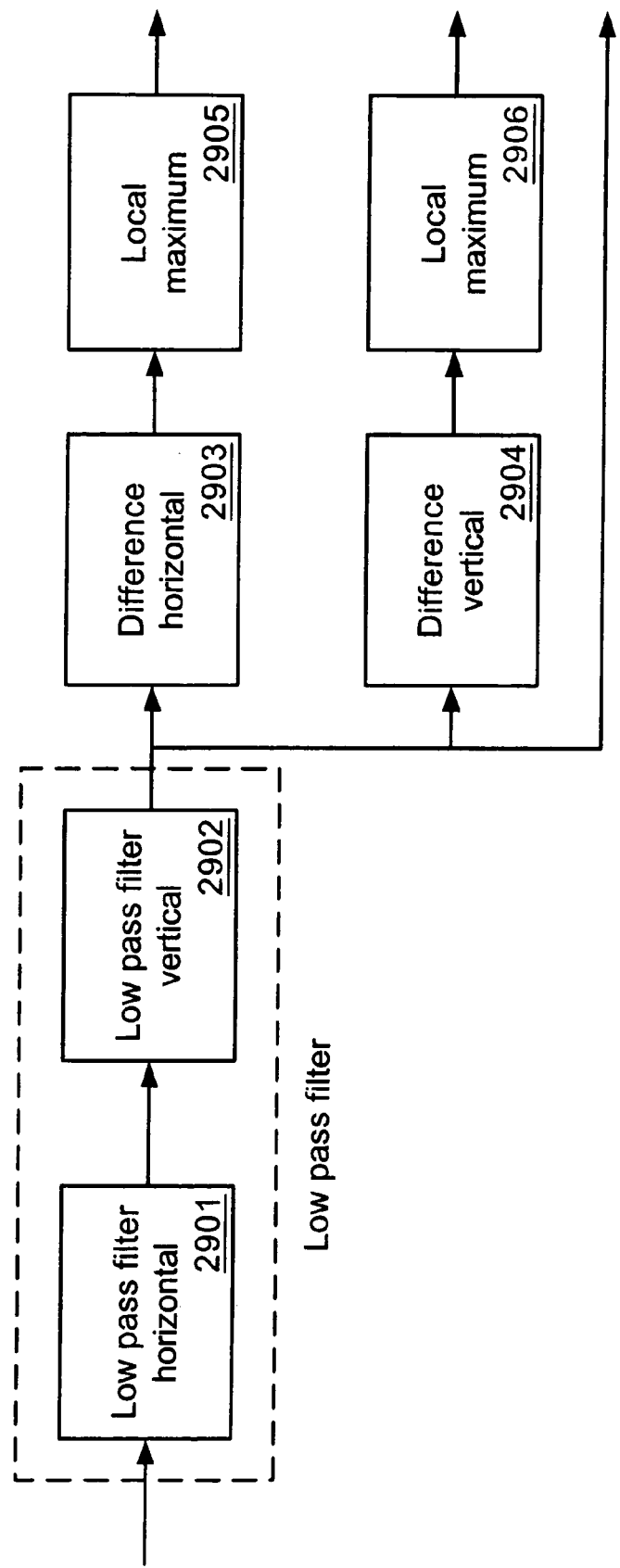
FIG. 29 illustrates an edge extraction embodiment that generates a difference of gaussian edge extraction for one resolution.

Edge extraction uses a difference of gaussian technique as shown in FIG. 29. To locate edges with single pixel accuracy, no subsampling is performed. While any type of low pass filter could be used, separable horizontal and vertical filters are convenient for computational efficiency. Using odd length filters results in no phase shift. A good choice is the following filter taps (followed by division by 16):

1 4 6 4 1

In the present invention, the edge extraction process initially subtracts pairs of adjacent pixels (horizontally or vertically adjacent). The present invention saves, as potential edge locations, differences with magnitude that are greater than at least one neighbor in the direction of the difference. Other, smaller, differences are ignored. Also, differences below a threshold (for example 8) are ignored.

Referring to FIG. 29, a low pass filter comprises a low pass horizontal inverse transform filter and a low pass vertical transform filter. The output of lowpass filter 2902 is used as the input of the low pass filter in the next resolution. Filter outputs are processed by the horizontal difference

2903, used for local maximum 2905, and the vertical difference 2904, used for local maximum 2906. Edge locations in different resolutions are compared. Edge locations (outputs of the local maximum units) are saved if in the next higher or lower resolution, the corresponding location or one of its four neighbors is a saved potential edge location with the same sign. Real edges happen in the same place in different scales and artifacts don't (i.e., the artifacts don't line up).

One use of the location of edges is for adaptive filtering that preserves edges while reducing ringing artifacts. One way of implementing this is to use the 5-tap low pass filter described above section on five sample windows with no edge. If there is an edge in the center of the five sample window, the sample is used unchanged (no filtering). When there is one or more edges in other positions in the window, only the samples and taps in the center of the window not including or outside of the edge(s) are used and the filter's divisor is the sum of the taps used. Multiple (e,g., 2) iterations of the filter can be used. This filter tends to sharpen edges. Pixels next to edges are influenced by pixels farther from the edge, which tends to oppose previous blurring of information from the other side of the edge.

Using a Preferred Spatial Domain Image

Figure 30:
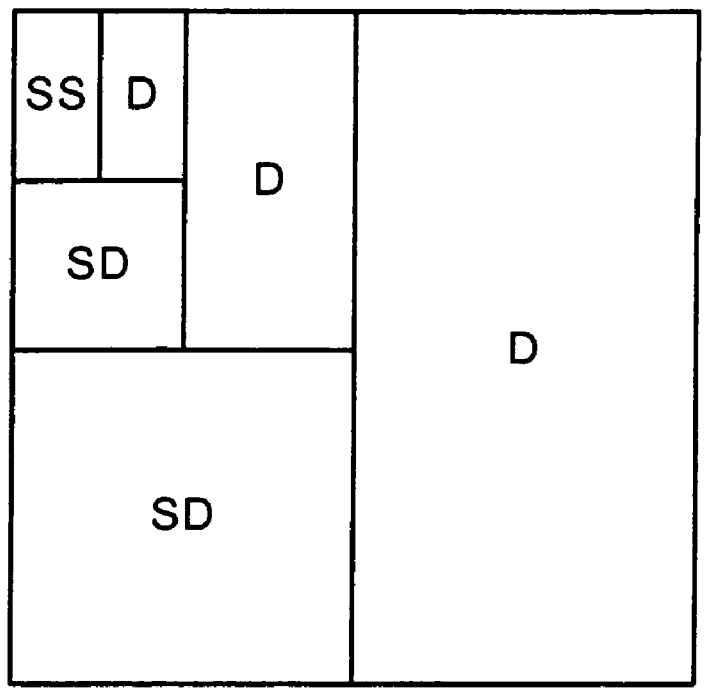
FIG. 30 illustrates a partial transform for use in reconstruction.

The present invention creates a preferred reconstruction as follows. First, the present invention creates a preferred spatial domain image. For example, the edge preserving adaptive filter method described above may be used. Next, the present invention performs a partial wavelet transform of the preferred image. The horizontal transform is performed normally. Only the S outputs of the horizontal transform are processed by the vertical transform. The D outputs of the horizontal transform are not processed. See FIG. 30. Then, the present invention clips coefficients from the partial transform to the valid range of the quantized coefficients to create preferred reconstruction.

The spatial domain preferred image may be updated in regions where coefficients are clipped and the process iterated if desired.

Low Pass Coefficients Covering Edges

The edge finding method of the present invention locates edges with single pixel accuracy. S or SS coefficients in the inverse wavelet transform correspond to multiple pixels. The number of pixels is $2^{2*level-1}$ for S coefficients and is $2^{2*level}$ for SS coefficients. If any of the pixel locations corresponding to an S or SS coefficient contain an edge, that coefficient is considered to be an edge.

For the S or SS coefficients in the center of a five sample window for decomposition levels greater than 1, using the full $(2^{level})(2^{level})$ or $(2^{level})(2^{level-1})$ edge search region might not be desirable. Detecting an edge in the center of the window when it is really on the boundary can reduce the opportunity for finding a good reconstruction. Instead a smaller search region in the direction of the transform such as $(2^{level-1}*2^{level})$ or $(2^{level-1})(2^{level-1})$ or $(2^{level-2})(2^{level-1})$ may be used. Using −1 for level 2 and −2 for levels greater than 2 may be used.

Once the S or SS coefficients that cover edges are known, mirroring can be used for those coefficients on or on the other side of edges.

Clipping Reconstructions

Figure 31:
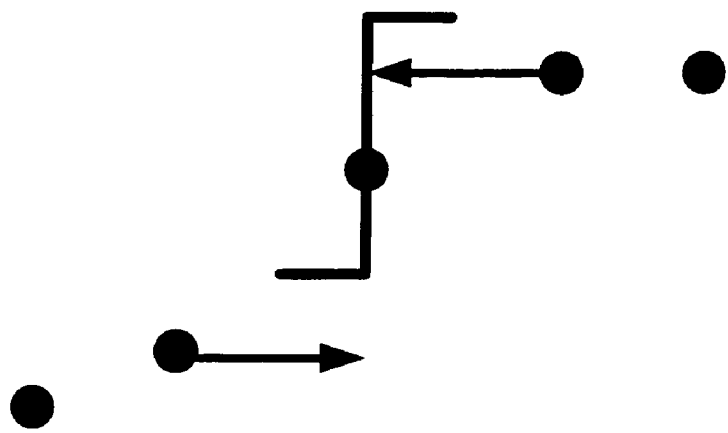
FIG. 31 illustrates a clipping reconstruction.

Particularly for reconstructions that attempt to sharpen edges, clipping reconstructions so they do not exceed the bounds of neighboring S coefficients is useful and reduces ringing. FIG. 31 illustrates a clipping reconstruction. In one embodiment, either the immediate neighbors of the center sample may be used or the closest in value to the center sample of the two neighbors on either side.

FIG. 31 illustrates that sample value (e.g., pixel) range of the reconstructed value for the center S coefficient exceeds the value of the fourth S coefficient. In such a case, if the reconstructed value is greater than the neighboring sample, such as S coefficient four, its value is clipped to the value of the neighboring pixel, e.g., S coefficient four. Similarly, the possible reconstructed value of the center sample does not include the value of the second S coefficient, which is next to the center pixel in FIG. 31. In such a case, the allowable value of the center sample may be extended to the value to be the value of the that sample, so clipping is not indicated. Note, however, in either case, changing one side of the allowable range of the reconstructed value causes a corresponding change in the other side of the range. For instance, if the upper range of the reconstructed value for the sample must be clipped to be no greater than the fourth sample value, then likewise the range below the center sample is also reduced. Therefore, in this manner, the present invention provides for clipping reconstruction that do not exceed the bounds of the neighboring coefficients and reduced ringing.

Texture Extraction

Wavelets are good at representing edges and smooth regions. Texture is difficult to represent because it must be represented as many small edges. There are many ways to represent texture, for instance, see WP. K. Pratt, Digital Image Processing, John Wiley and Sons, 1978. The present invention provides a representation of texture which can be better than the texture model inherent in DCT based compression methods such as JPEG. Sinusoidal grids are used.

To enable texture extraction, the following operations occur during encoding. The present invention generates a residue image containing texture not well represented by wavelets. To do so, first, the present invention generates a reconstructed image after quantization. For example, the present invention quantizes one MSE importance level more than the approximate target compression. Second, the present invention subtracts the quantized, reconstructed image from the original image. This is the residue image.

Next, the present invention models the texture in the residue image. One way is to find the 1D sinusoid with arbitrary rotation in 2D and arbitrary phase and arbitrary frequency that has the largest correlation with each 16×16 block of the residue image. Then the present invention outputs the texture model parameters as a comment in the compressed data stream.

Figure 32:
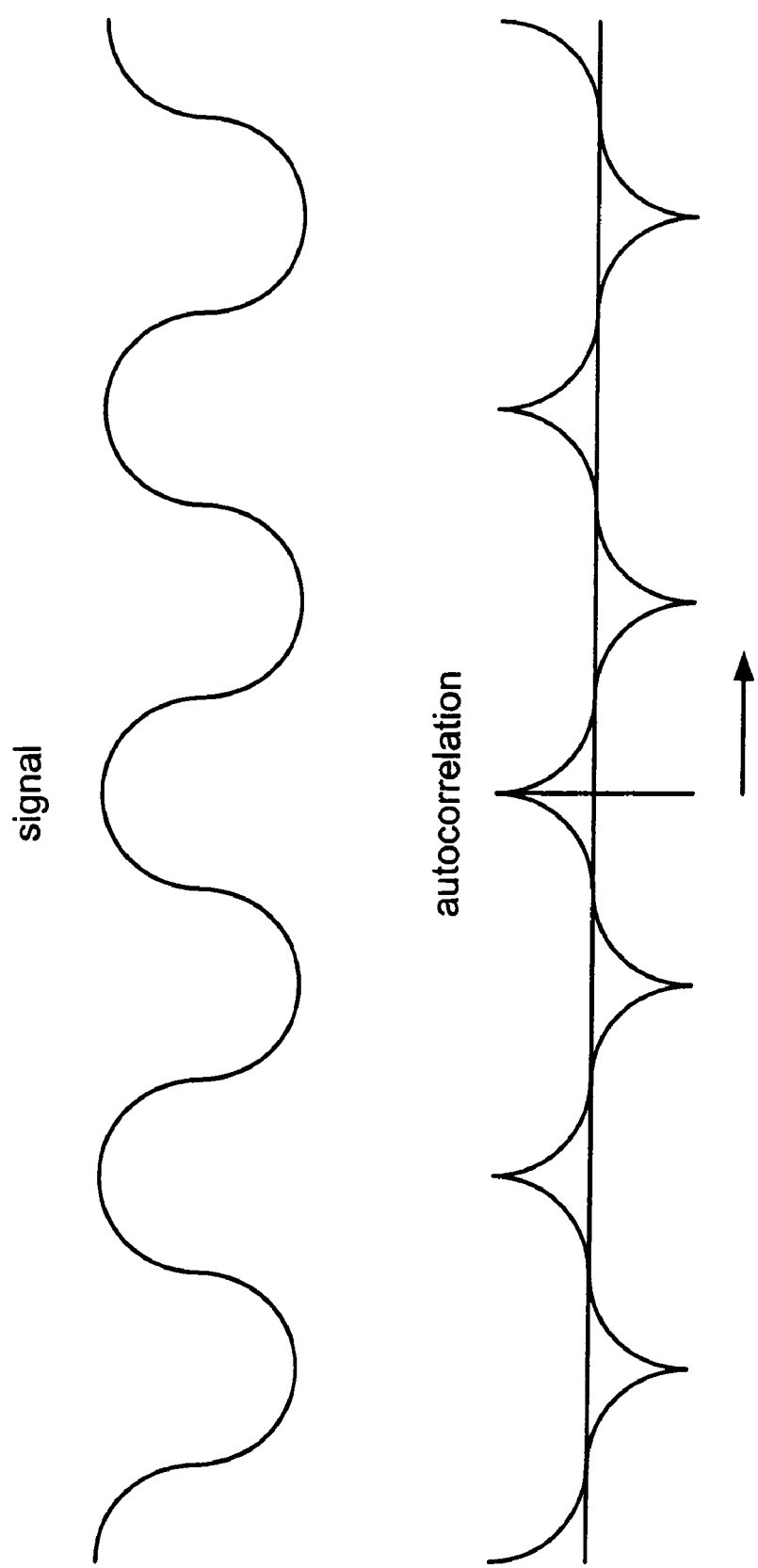
FIG. 32 illustrates the correspondence between the period of a sinusoid and a negative correlation.

In the process above, the most important step is modeling the texture. Correlating with sinusoids is computationally expensive. Autocorrelation is used to limit the search space for sinusoids. The 2D autocorrelation is computed for blocks for the residue image. The half the period of a sinusoid corresponds to negative autocorrelation (see FIG. 32). Only the first region of negative correlation around zero is of interest.

The region of negative autocorrelation can be searched as follows for each integer $x_i, y_i$ position in the region. The step size (step) can be ¼ or ⅛. The threshold can be 4.75. Other step sizes and thresholds may be used.

```
FOR x = x_i - 1 + step TO x_i STEP step
    FOR y = y_i - 1 + step TO y_i STEP step
        r = sqrt (x² + y²)
        IF r < threshold THEN
            x = x/r
            y = y/r
            correlate with sinusoid r, x, y
```

The value of r is half the period of the sinusoid. The parameters x and y are a unit vector which specifies the angle to rotate the 1D sinusoid. These parameters are used both for determining the best match during encoding and for generating texture during decoding.

FOR j IN vertical region to correlate with sinusoid
FOR i IN horizontal region to correlate with sinusiod $\theta = \pi*(i*x+j*y)/r$ coef_c=cos θ*residue [i, j]
coef_s=sin θ*residue [i, j]
correlation=sqrt(coef_c²+coef_s²)

Using this model, the four parameters are stored as a comment in the coded data stream such as x, y, coeff_c and coeff_s. The parameters coeff_c and coeff_s can be quantized to 0.5 steps.

During decoding, the quantized image used to generate the residue is created. The information in the texture comment is used to generate sinusoids. The sinusoids are added to the quantized image, resulting in a preferred reconstruction image. The preferred reconstruction is used the preferred spatial domain size. If the wavelet coefficients available to the decoder are more accurate than those used in the quantized image used for generating the residue, some of the artifacts due to the texture model are reduced.

Instead of using a block based texture model, a continuous or overlapped model may be used.

The model above is good for modeling stripes and similar 1D textures. It can be extended to handle 2D sinusoidal grids. In autocorrelation space, the area along the line perpendicular to x, y (and going through 0,0) can be searched for the first negative region. The length along this perpendicular direction can be used to specify the half-period of the sinusoid in this direction.

The region of negative autocorrelation might be used as a first step in other texture modeling methods. For example, it might be used to generate structured noise.

Special Buffer for a Tile

In one embodiment, the coding method of the present invention is implemented in software running on one or more processors in a computer system. In this type of system, the context model of the present invention examines many coefficients and uses many pointers to keep track of these coefficients that will be used to provide a context for a coefficient to be coded later temporally. The pointers point to memory locations that contain the coefficients that are used for the context. Also, a set of offsets, both horizontal and vertical, are maintained to determine how to update the pointers to point to the memory locations for the next context. The horizontal offset is the distance from the current coefficient to the next coefficient to the east, and the vertical offset is the distance from the current coefficient to the south. These offsets are dependent on the memory and how the coefficients are stored in the memory. The context model handles edges using special cases when the coefficients that are needed to provide a context do not exist because of the presence of an edge or boundary condition.

FIGS. 38A and 38B illustrate two examples of nine pointers that are maintained to point to memory locations for determining the next four coefficients X, Y, U, and V. Referring to FIG. 38A, the nine pointers include pointers to coefficients N, X, U, and S. Farther to the left of the N, X and U coefficient are three additional coefficients NW, XW and UW. To the right are two additional coefficients XE and UE. The NX, U and S pointers are used to access the locations shown in dashed boxes. FIG. 38B illustrates pixel values X another version in which the nine values are NW, XW and UW on the left side with NX, X and U forming a middle column and NY, Y and V forming a column to the right. Note that in this case, the S and E information is stored in signaling bits. When updating the memory location of U, a determination is made as to what is occurring with respect to S. When X is being coded, NX is updated, which eventually becomes the U position.

To improve context modeling in a software driven computer system implementation, the present invention uses a special buffer for each tile when providing contexts. The buffer is a block of memory that may be a fixed or variable sized block of contiguous memory with the size of the block of memory being greater than the size of the tile (or frequency band) stored or to be stored therein. For instance, if the tile is 256 coefficients in each dimension, the block of memory may be 384 coefficients in each dimension. An example is shown in FIG. 33. Therefore, no matter what the tile size is, a larger area of memory is allocated to it. The block of memory does not have to be the same shape as the tile stored within it. For example, a block of memory allocated to a square tile does not have to be square itself.

The advantage of using a larger block of memory is that the pointers can be replaced with a single pointer to a predetermined point in the tile (e.g., upper left corner) and a set of offsets. These offsets are fixed for each subband. Thus, instead of 9 pointers and at least two offsets in the case of the context model described above, only one pointer and a set of offsets are necessary. In one embodiment, one pointer to the northwest (NW) coefficient is used with two fixed offsets in the horizontal and vertical for coefficient access. The correct number of applications of the offsets are used from the NW pointer to the other 9 locations.

One benefit of such an approach is a reduction in the number of registers needed. The offsets need not be stored in registers or storage space as part of the compiled code; they are constants.

Note that although the present invention replaces multiple pointers with one pointer (but less than that previously required) and multiple offsets, it is apparent that more than one pointer could be used with a lesser number of offsets depending on the implementation.

Another advantage of the present invention is that if the size of the memory block is selected correctly, then as processing continues across the tile, the tiles tend to hit different cache lines. The selection of the size is also based on the compiler or the target machine, i.e. the machine on which the software is to be run. In one embodiment, the size of the buffer is selected with the zero band to be not a multiple of a cache association size. If it is at an off multiple, there is better chance to stay within the cache. With proper selection of size, there is a greater likelihood that locally used portions of the tile may be kept within the cache without reusing the same cache lines again, which is desirable. Thus, the proper selection of the size of the buffer allows for better use of the cache.

The present invention also effectively handles edge cases. For handling edges, there is no need to check if processing of an edge is occurring because the values outside the tile in the buffer at the edge are defined to be a predetermined value. In other words, based on the pointer value, those coefficient values needed for a context that fall outside the tile are chosen to be the predetermined value. In one embodiment, the predetermined value is zero. If mirroring is used, these values may not be the same for all tiles. Thus, the tile is padded with zero coefficients filling the remaining space in the buffer to enable the off edge conditions to be correct.

Note that in an alternative embodiment some of the values outside the tile may have values set to non-zero.

Common Occurrence Context Modeling

In the present invention, a context model uses a coefficient's neighborhood and generates a context and a bit, which are sent to an entropy coder. A frequently used context (greater than 15-25% of the time) is likely to have "runs" where the same context occurs frequently.

The FSM decoder, receiving the same context as an input, performs a feedback loop in response to each context. The feedback loop includes operations such as shifting bits, updating a register, etc. The feedback loop and the operations associated with it are time consuming. It is desirable to perform the feedback loop only once for all of the repetitive contexts in a row, if possible, to reduce this overhead.

In one embodiment, the same context may occur typically in three situations:

1) In performing Look Ahead as described in FIG. 16, Table 7 D2, and Table 8 C2, D2 can be determined for the current position to the edge of the image. This may be many look ahead intervals. If the previous C2 bit was zero, C2 will use the same context for all the look ahead intervals as long as the decoded bits are zero.

2) After the look Ahead for the TT-transform failed, referring to FIG. 17 and Table 8, C3 for up to 16 bits, if the neighborhood is zero, the same context is used as long as the decoded bits are zero; and 3) With respect to FIG. 19 and Table 8 C5, if neighborhood is zero, the same context is sued as long as the decoded bits are zero.

Storing previously decoded bits using runcounts of coefficients that are zero allows rapid determination of nonzero neighborhood bits, allowing runs that can be the same context to be determined.

In the present invention, the decoder operates speculatively in that is it indeterminate whether one of the contexts is occurring more often until a previous consecutive number of these contexts has occurred. The present invention examines the bitstream and determines whether there could have been a predetermined number of the same context in a row, and if so, the multi-step process of updating the FSM coder and the context model separately for all of the predetermined number of contexts is avoided and replaced with a single update. Thus, the FSM coder can skip ahead the predetermined number of positions in the bitstream. Similarly, the context model skips ahead.

Figure 34:
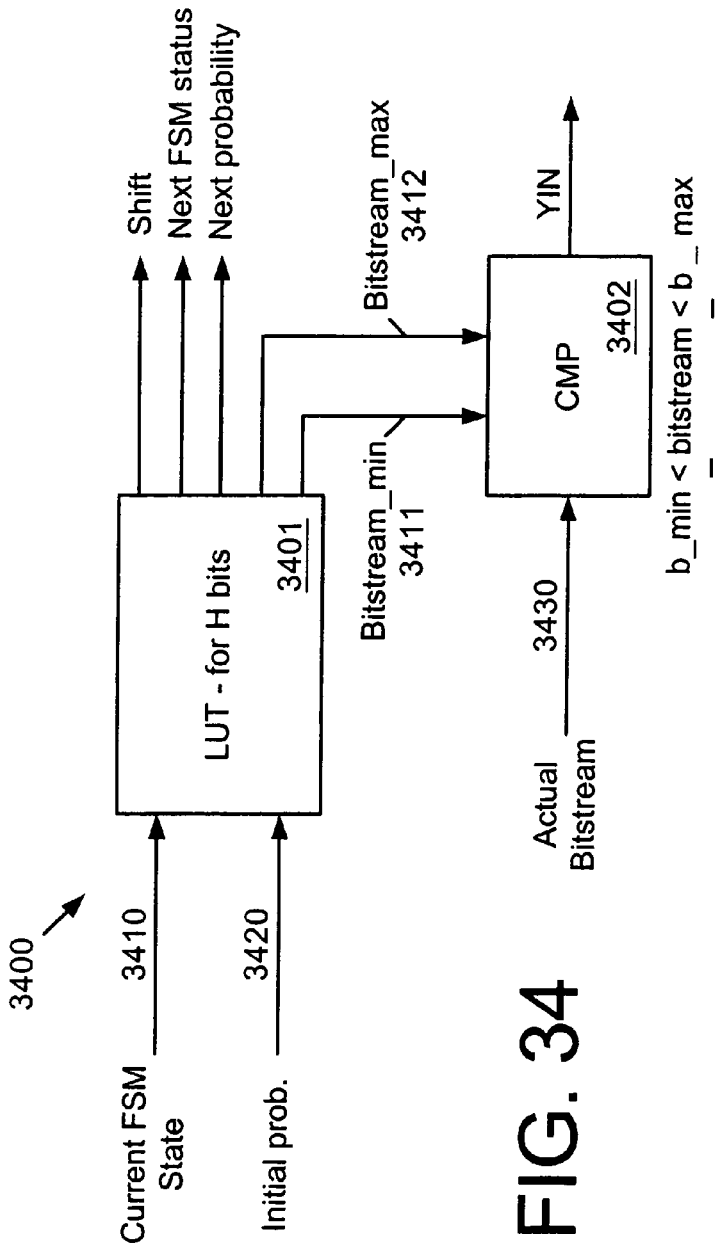
FIG. 34 illustrates one embodiment of an FSM coder for use with common occurrence context modeling.

FIG. 34 illustrates one embodiment of the present invention. Referring to FIG. 34, FSM coder 3400 includes a lookup table (LUT) 3401 coupled to receive the current FSM state 3410, the current probability state 3420 for the context, and bits 3430 in the encoded bit stream that are being decoded. If the same context occurs multiple times in a row, then the bit is decoded for each occurrence of the context. If the actual bitstream matches a pattern of bits corresponding to the current FSM state and an initial probability that indicate that a predetermined number (e.g., 5) of the same probability-class decisions will occur in a row, then the decoder performs the predetermined number of operations in a single operation, including updating the FSM state and the context model, including their pointers.

Referring back to FIG. 34, the LUT 3401 is for n bits and is coupled to receive current FSM state 3410 and an initial probability 3420. Based on these inputs, a bitstream maximum 3412 and a bit stream minimum 3411 are output. These two bit stream outputs are compared to actual bitstream 3430 using a comparator 3402. If actual bitstream 3430 is less than or equal to bitstream maximum 3412 and greater than or equal to bitstream minimum 3411, then the output of comparator 3402 indicates that the speculative decode may occur (e.g., its output is set to yes (Y)); otherwise, the output of comparator 3402 indicates that the speculative decode should not occur.

The shift output of LUT 3401 is coupled to a bit shifter that shifts in the actual bit stream 3430. The bit shifter also receives the yes/no output of comparator 3402 as an enable signal. The next FSM state is sent to an FSM state register which feeds back to provide the current FSM state 3410. The FSM state register also receives the yes/no output of comparator 3402 as an enable signal. The next probability output from LUT 3401 is sent to the context memory storing the context along with the yes/no output of comparator 3402 which acts as a right enable. Note that the yes/no output of comparator 3402 is also sent to context model.

Note that when the speculative decode does not occur, the bits in actual bitstream 3430 are decoded in the normal, bit-by-bit fashion described above.

The bitstream maximum 3412 and minimum 3411 are used, instead of one bitstream, to compensate for the fractional bit case where the encoder does not output a bit for each FSM state. In this case, other bits may have to be examined in actual bitstream 3430. That is, in response to an n-bit run, the encoder generates a bit stream and changes to the FSM state depending on the bits after the n-bit run. The encoder eventually outputs bits in the encoded bitstream after the run of identical contexts which were based in part on that original run of contexts. The bitstream maximum and minimum ensures that these bits are taken into account.

In one embodiment, the lookup table also outputs the next FSM state, the next probability estimate and the shift indication that specifies the amount of bits to shift in the actual bitstream that is incoming. Note that any or all of these may be provided by separate tables.

Figure 35:
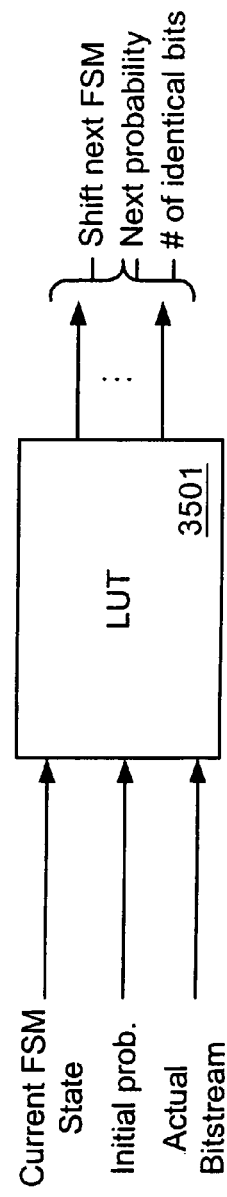
FIG. 35 illustrates a single lookup table that may be included in an FSM coder for use with common occurrence context modeling.

In an alternative embodiment, a single lookup table, such as LUT 3501 of FIG. 35, may receive the current FSM state, the initial probability and the bitstream. In response to these inputs, the table might output a y/n indication, or an indication of the number of times the context occurred. Note that in this embodiment, instead of a fixed run length (e.g. 4), the run length is variable 0,1,2,3,4,5,6,7. However, one problem with this embodiment is that the table is bigger.

Distortion Spreading Over Tiles

In one embodiment of the present invention, tags are included in the encoded data stream. For example, one tag indicates the number of bits that are encoded at each importance level, summed over all the tiles. This is the BVI tag. This tag can be used to achieve fixed-sized quantization for the decoded data having equal fidelity or quality in each tile.

The BVI tag relates the number of bits to importance levels on an image-wide basis. This optional tag is used in the main header. The size of this variable-length tag depends on the number of importance levels enumerated by the encoder.

BVI: Table 11 shows the size and values for the tile length main header parameters.

TABLE 11

Bits versus importance levels values

| Parameter | Size (bits) | Values |
|---|---|---|
| BVI | 16 | 0xff61 |
| Lbvi | 16 | 10-65535 |
| Cbvii | 8 | 1-255 |
| Ibvii | 16 | 0-65535 |
| Pbvii | 32 | 0-(232 − 1) |
| res | 8 | 0 (if necessary) |

Lbvi: Length of tag in bytes, not including the marker (the length is even).

$Cbvi^i$: This signals which component data is being described. This Cbvi parameter, along with Ibvi and Pbvi, form a record that is repeated for every component and importance level chosen to be described. The tags are in order, with all importance-level descriptions in the first component followed by those for the next component and so on.

$Ibvi^i$: The number of the importance level, in the current component, encoded by the number of bytes in Pbvii. This number (or numbers) is selected at encode time to communicate interesting points in the rate-distortion curve. This Ibvi parameter, along with Cbvi and Pbvi, form a record that is repeated for every component and importance level described.

$Pbvi^i$: Number of bytes in the coded file that include the main and tile headers and all data that relate to the number of importance levels in Ibvii. This Pbvi parameter, along with Cbvi and Ibvi, form a record that is repeated for every component and importance level described.

res: A filler byte of zeros that is placed at the end, as needed.

To decode data to a fixed size representation with a fixed fidelity given that the data was encoded with tiles, the present invention uses importance level entry points. At a minimum, each tile has one entry point. These are specified in the tags described herein. Note that where a constant distortion over all tiles is not necessary, a fixed-rate quantization can be obtained by decoding a particular number of bytes at a particular resolution for each tile. However, this does not ensure each tile has the same fidelity, just that each tile has the same amount of data.

In one embodiment of the present invention, the decoding maintains a constant distortion by quantizing at the same importance levels in each tile. Note that this may result in different amounts of data for each tile; however, the fidelity of each tile is the same. Thus, the present invention provides for decoding so that the same quality of distortion is in each tile with the decoded bits being distributed non-proportionally (non equally) among the tiles. In this way, a constant distortion over the entire image may be obtained.

As an example of why tiles might have different amounts of data for the same fidelity, one tile might contain a complex natural image requiring a lot of coded data, while another tile might be a blank region requiring little data.

As discussed above, the BVI tag may be used to obtain the number of bytes for a given importance level across the entire image. In other words, the BVI tag indicates how many bytes in an importance level.

In order to obtain the same quality of distortion across each tile, the present invention determines the number of bytes used to encode each importance level over the n tiles. This information may be determined from the BVI tag. If a predetermined number, x, bytes are desired in the decoded image, the bytes of each importance levels are added up and a determination is made of where to stop in the importance level for each tile. In other words, only a certain number of bytes are decoded to obtain the same fidelity, and decoding is stopped at the same importance level for every tile.

For example, if the BVI indicated the following summation of bits across the entire image for the importance levels (the 16,011 bits listed next to importance level 12 indicate the total number of bits for importance levels 12 and 13) shown:

| Importance Level | No. of Bits |
|---|---|
| 13 | 4,096 |
| 12 | 16,011 |
| 11 | 40,000 |
| 10 | 100,000 |
| 9 | 250,000 |
| 8 | 500,000 |
| 7 | 1,000,000 |
| 6 | 2,500,000 |
| 5 | 5,500,000 |

For example, only 750,000 bits may be allowed in the decoded image, then all that can be decoded (as the 1,000,000 bits tested with importance level 7 includes the 500,000 bits of importance levels 8-13) is through importance level 8 and half of importance level 7.

The present invention provides for numerous alternatives for deciding where to stop decoding in the data. One could decode importance levels until the data ran out. For example, in the example above, one could decide to decode from importance level 13 down to half way through importance level 7. In another embodiment, a percentage could be determined for each level and then that percentage may be applied to each of the importance levels. For instance, if only half of level 7 was to be decoded as determined above, this fifty percent could be applied to all of the levels until the data ran out, instead of only one half of the data after importance level 8 would be decoded. Thus, in this case, the total percentage between the budgeted amount of decoded data and the data to be decoded dictates the decision on where to stop decoding on each importance level. Thus, the present invention provides for providing a fixed size representation with the same fidelity across each tile. In other words, the target size of the image is fixed with the different segments contained therein having different data rates.

The application of the present invention is affected by the alignment. In one embodiment, the data is in a normalized alignment, such as shown in FIG. 39. In an alternate embodiment, the data is in the pyramidal alignment, such as shown in FIG. 40. Although the above example is performed with a normal alignment, the present invention can be performed while decoding data encoded with a pyramidal alignment to obtain a fixed size image with the same fidelity across all tiles, with a normalized alignment. The use of the normalized alignment produces the best quality with respect to squared error. Once again, the data in the BVI tag indicates the total number of bytes from which the present invention subtracts the number of bytes that are allocated to the decoded image. If the data is in a pyramidal alignment with entry points, the entry points allow skipping ahead and truncating the correct amount of data at each segment. In one embodiment, truncation is performed in a normalized fashion, resulting in the best MSE.

For instance, based on the determination of the amount of data that is allowed through the use of the BVI tag, a decision to truncate the data may be made across importance levels of each pyramid level where the data is in a pyramidal alignment. For instance, referring to FIG. 40, the data may be decoded from importance level 30 to importance level 25 and then truncated from importance level 24 to 20. Decoding of the data would also occur from importance level 19 to importance level 15 followed by truncation from importance level 14 to 10, and decoding of the data would occur from importance level 9 to importance level 5 with truncation from importance level 4 to 0. Thus, for each of the frequency bands at different levels, the same data is being truncated, and in this format, it is known what impact such truncation will have. This is equivalent to truncating the data in the normalized alignment at level 5.

In another scenario, if the alignment is normal, pyramidal quantization is possible by similar means. If there is an entry point at the beginning of each importance level, then each importance level can be decoded up to the pyramidal levels of interest. For example, in FIG. 40, if the image resolution is to be reduced by two in each dimension (pyramidal level 1 is to be quantized), each the data corresponding to pyramidal importance level 3 and 2 are decoded. When complete the decoder drops to the beginning of the next importance level.

It should be noted that every frequency band may be set forth in a pyramidal arrangement in which each frequency band follows the other. This does increase the number of importance levels dramatically. However, because each frequency band has a single width, it facilitates the truncation of data so that its affect on the rest of the image is better understood. Note that this would require a number of resets to bring one back to the beginning of each frequency band so as to allow one to truncate at the proper location.

Thus, in general, regardless of the alignment when its encoded, either normalized, pyramidal alignment, or any other alignment, the data may be decoded to obtain a constant distortion across all tiles based on information in the tags. The data in the tags helps determine what data to decode so as to achieve a fixed target image with the same resolution over all the tiles.

There can be a BVI for each color component and the user can decide how to allocate bits for each color component. The user can then use the BVI to determine the importance level to stop at for each component. Therefore, the amount of information in the components can be compared and contrasted and decisions can be made on how to allocate bits among the components.

Therefore, the BVI tag allows the specification of multiple components to enable the selection of a percentage of bits from each of the multiple components for truncation. This ensures the distribution across all tiles regardless of the rate, with no equal rate or size per tile.

The data in a BVI tag can be synthesised, or supplemented, by the IET or IEM, and the ILT or ILM tag information. Each of these tags point to importance levels in a tile. If they exist for all the tiles, this data can be added to create BVI-like information.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. A method for performing a reconstruction of an image, the method comprising:
   receiving a digital signal representative of an image;
   generating a reconstruction value of a pixel of the image; and
   clipping the reconstruction value if the reconstruction value exceeds the bounds of neighboring coefficients to create reconstructed data for a reconstructed image to be stored, wherein the reconstruction value is clipped to a coefficient value within the bounds of the neighboring coefficients.

2. The method of claim 1, further comprising transmitting the reconstructed image.

3. The method of claim 1, further comprising storing the reconstructed image.

4. The method defined in claim 1 using a center sample as the reconstruction value if the subsequent reconstruction value does not exceed the bounds of neighboring coefficients.

5. The method defined in claim 1 using a sample value of one of a plurality of immediate neighbors of a center sample as the reconstruction value if the subsequent reconstruction value does not exceed the bounds of neighboring coefficients.

6. The method defined in claim 5 wherein the sample value of the one of the plurality of the immediate neighbors has a value closer to the center sample than the other of the plurality of the immediate neighbors.

7. The method defined in claim 1 wherein the neighboring coefficients comprise neighboring S coefficients.

8. The method defined in claim 1 where the reconstruction value is clipped to a coefficient value of a neighboring coefficient with a value closest to the reconstruction value.

* * * * *